(12) United States Patent
Jones et al.

(10) Patent No.: US 11,050,395 B2
(45) Date of Patent: Jun. 29, 2021

(54) RADIO FREQUENCY (RF) AMPLIFIER

(71) Applicant: NXP USA, Inc., Austin, TX (US)

(72) Inventors: Jeffrey Kevin Jones, Chandler, AZ (US); Cedric Cassan, Muret (FR); Damien Scatamacchia, Toulouse (FR)

(73) Assignee: NXP USA, Inc., Austin, TX (US)

(*) Notice: Subject to any disclaimer, the term of this patent is extended or adjusted under 35 U.S.C. 154(b) by 65 days.

(21) Appl. No.: 16/722,635

(22) Filed: Dec. 20, 2019

(65) Prior Publication Data
US 2021/0135639 A1    May 6, 2021

(30) Foreign Application Priority Data
Nov. 4, 2019 (EP) .................................. 19306423

(51) Int. Cl.
| | |
|---|---|
| *H03F 3/68* | (2006.01) |
| *H03F 3/191* | (2006.01) |
| *H03F 3/26* | (2006.01) |
| *H03F 1/56* | (2006.01) |
| *H01L 23/66* | (2006.01) |

(52) U.S. Cl.
CPC ............ *H03F 3/265* (2013.01); *H01L 23/66* (2013.01); *H03F 1/565* (2013.01); *H01L 2223/6611* (2013.01); *H01L 2223/6655* (2013.01); *H03F 2200/06* (2013.01); *H03F 2200/09* (2013.01); *H03F 2200/222* (2013.01); *H03F 2200/225* (2013.01); *H03F 2200/387* (2013.01); *H03F 2200/391* (2013.01); *H03F 2200/451* (2013.01)

(58) Field of Classification Search
CPC ............ H03F 3/68; H03F 3/191; H03F 3/193

USPC .................................................. 330/295, 302
See application file for complete search history.

(56) References Cited

U.S. PATENT DOCUMENTS

| | | | |
|---|---|---|---|
| 5,066,925 A | * | 11/1991 | Freitag ..................... H03F 3/602 |
| | | | 330/269 |
| 7,268,627 B2 | | 9/2007 | Samelis |
| 8,164,387 B1 | | 4/2012 | Apel et al. |
| 9,041,465 B2 | | 5/2015 | Bouisse |
| 9,692,363 B2 | | 6/2017 | Zhu et al. |
| 10,153,738 B2 | | 12/2018 | Ladhani et al. |
| 10,211,785 B2 | | 2/2019 | McLaren |

(Continued)

OTHER PUBLICATIONS

NXP Semiconductors, "RF Power GaN Transistor", Technical Data, Document No. A3G22H400-045, Rev. 0, 9 pgs. (May 2018).

(Continued)

*Primary Examiner* — Steven J Mottola

(57) ABSTRACT

Embodiments of a device and method are disclosed. In an embodiment, an RF amplifier includes first and second RF signal paths having RF input interfaces, RF output interfaces, and corresponding transistors connected between the respective RF input interfaces and RF output interfaces, wherein control terminals of the transistors are connected to the RF input interfaces and current conducting terminals of the transistors are connected to the corresponding RF output interfaces. The RF amplifier including a conductive path between the current conducting terminal of the first transistor and the current conducting terminal of the second transistor, wherein the conductive path includes a first inductance, a second inductance, and a capacitance electrically connected between the first inductance and the second inductance.

16 Claims, 19 Drawing Sheets

(56) References Cited

U.S. PATENT DOCUMENTS

| | | |
|---|---|---|
| 2011/0001566 A1* | 1/2011 | Seki .................. H03F 1/56 330/295 |
| 2015/0294930 A1 | 10/2015 | Zhu |
| 2016/0285418 A1 | 9/2016 | Jones et al. |
| 2017/0040953 A1 | 2/2017 | Beltran Lizarraga et al. |
| 2018/0241352 A1 | 8/2018 | Wang |
| 2018/0309411 A1 | 10/2018 | Cabrera et al. |
| 2019/0190464 A1 | 6/2019 | Peyrot et al. |

OTHER PUBLICATIONS

Anaren, Xinger III, Hybrid Coupler 3dB, 90°, Model X3C19P2-03S, Rev E, 24 pgs., retrieved from the Internet, https://cdn.anaren.com/product-documents/Xinger/90DegreeHybridCouplers/X3C19P2-03S/X3C19P2-03S_DataSheet(Rev_E).pdf on Oct. 29, 2019 (Mar. 2012).

* cited by examiner

RADIO FREQUENCY (RF) AMPLIFIER

CROSS-REFERENCE TO RELATED APPLICATIONS

This application claims the priority under 35 U.S.C. § 119 to European patent application no. 19306423.5, filed Nov. 4, 2019 the contents of which are incorporated by reference herein.

BACKGROUND

Radio Frequency (RF) amplifiers are used extensively in wireless communications systems, including in Base Transceiver Stations (BTSs). Such RF amplifiers typically include at least one RF transistor that is packaged into a discrete device that is then attached to a printed circuit board (PCB) to form an RF amplifier. When used in BTSs for wireless communications, it is desirable that RF amplifiers are compact, thermally efficient, and able to efficiently deal with modulated signals that exhibit a high Peak-to-Average Ratio (PAR).

SUMMARY

Embodiments of a device and method are disclosed. In an embodiment, an RF amplifier includes a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface, a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface, and a conductive path between the current conducting terminal of the first transistor and the current conducting terminal of the second transistor, wherein the conductive path includes a first inductance, a second inductance, and a capacitance electrically connected between the first inductance and the second inductance.

In another embodiment, a packaged RF amplifier device is disclosed. The packaged RF amplifier device includes a device substrate, a first RF signal path having a first RF input lead, a first RF output lead, and a first transistor coupled to the device substrate and electrically connected between the first RF input lead and the first RF output lead, wherein a control terminal of the first transistor is connected to the first RF input lead and a current conducting terminal of the first transistor is connected to the first RF output lead, a second RF signal path having a second RF input interface, a second RF output interface, and a second transistor coupled to the device substrate and electrically connected between the second RF input lead and the second RF output lead, wherein a control terminal of the second transistor is connected to the second RF input lead and a current conducting terminal of the second transistor is connected to the second RF output lead, and a microstrip transmission line between the current conducting terminal of the first transistor and the current conducting terminal of the second transistor, wherein the current conducting terminal of the first transistor is connected to the microstrip transmission line by at least one conductive wire bond and the current conducting terminal of the second transistor is connected to the microstrip transmission line by at least one conductive wire bond and further including a capacitance electrically connected to the microstrip transmission line.

In another embodiment, a push-pull RF amplifier is disclosed. The push-pull RF amplifier includes an input balanced unbalanced transformer (balun), an output balun, and an RF amplifier connected between the input and output baluns. The RF amplifier includes a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface, a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface, and a conductive path between the current conducting terminal of the first transistor and the current conducting terminal of the second transistor, wherein the conductive path includes a first inductance, a second inductance, and a capacitance electrically connected between the first inductance and the second inductance.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
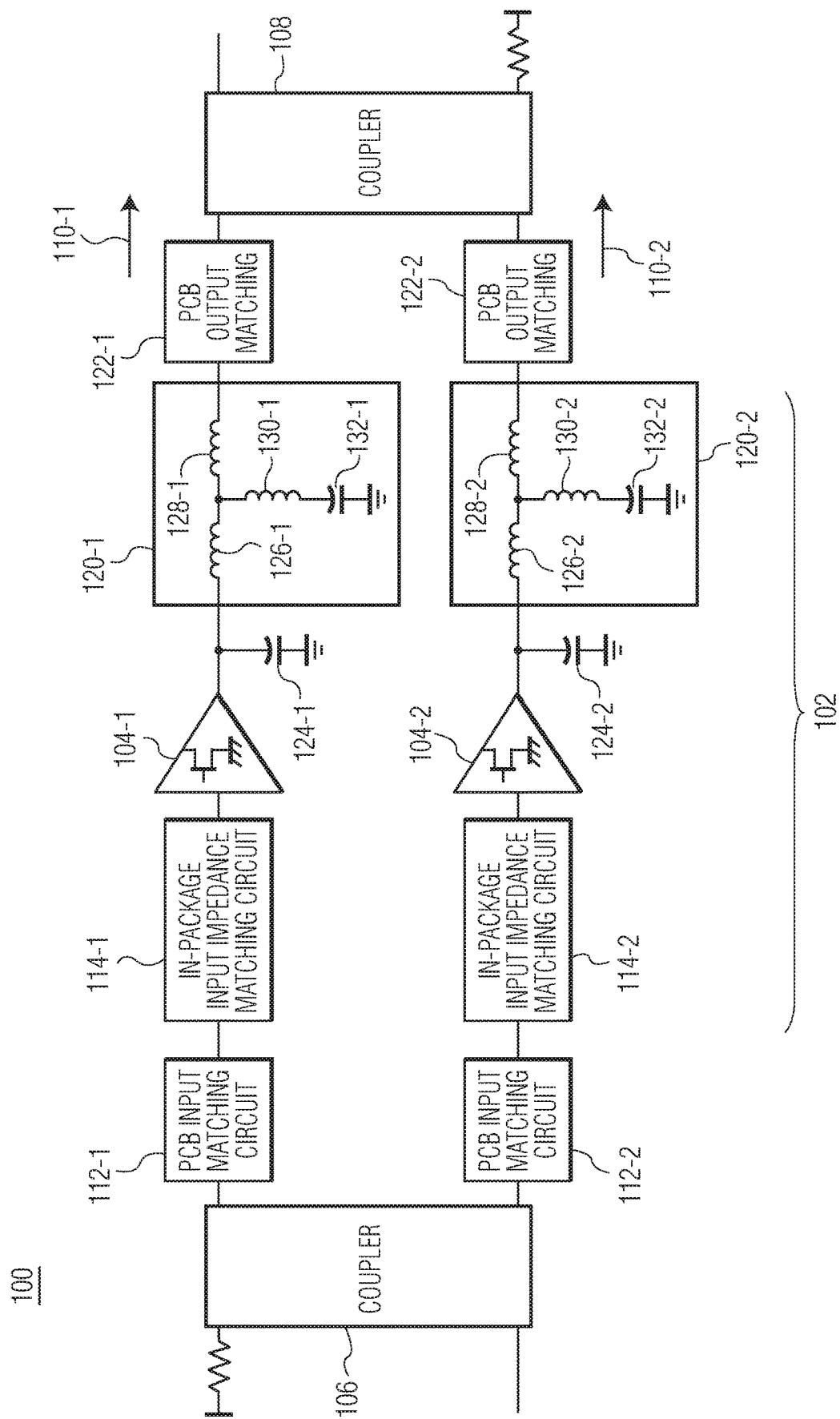
FIG. 1 depicts an RF amplifier that includes a transistor assembly having two transistors that form portions of two RF signal paths that have balanced RF power amongst the two paths.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

RF power amplifiers used in base station transmitters for the wireless infrastructure market (including the 4G and 5G markets) should be compact, configured to dissipate significant thermal energy generated by the amplifier transistors with relatively compact heat-dissipation structures, and should be able to handle modulated signals with a high Peak-to-Average Ratio (PAR). To address the thermal constraint of such amplifiers, efficient solutions that utilize gallium nitride (GaN) and silicon-based power transistor technologies have been considered. Additionally, to address the high PAR of the signals and to improve efficiency in back-off, advanced power amplifier techniques, including envelope tracking, have been considered. Envelope tracking involves continuously adjusting the power supply voltage applied to the RF amplifier to ensure that the RF amplifier operates at peak efficiency for the power required at each instant of transmission.

Conventional RF amplifiers are typically designed with a fixed supply voltage and operate most efficiently only when operating in compression. Such conventional RF amplifiers can become less efficient as the crest factor of the signal increases because the RF amplifier spends more time operating below peak power and, therefore, spends more time operating below its maximum efficiency. When envelope tracking is utilized, an RF amplifier is tuned close to its maximum efficiency at a low drain-source voltage (Vds), as the RF amplifier spends most of the time at a low Vds to maximize the efficiency. However, the RF amplifier should be able to deliver power at maximum Vds.

Thus, envelope tracking can increase RF amplifier efficiency not only at full BTS load (e.g., 8 decibels (dB) output power back-off (OBO)) but also at low loads (e.g., 18 dB OBO) where the BTS operates most of the time. Envelope tracking can therefore enable both capital expense savings due to higher efficiency at full load (e.g., smaller heat spreader needed so smaller remote radio head (RRH)), and operating expense savings for operation at medium to low loads.

A conventional RF amplifier structure used with envelope tracking includes multiple (e.g., two) transistors combined in quadrature with 3 dB couplers and no output matching. Although such an RF amplifier configuration may have desirable efficiency, such a configuration may exhibit peak-power (P2 dB) dispersion at a low Vds. Such dispersion can negatively impact an envelope tracking system. Such a system can be configured with in-package output impedance matching. However, large capacitors may be necessary. For example, FIG. 1 depicts an RF amplifier 100 that includes a transistor assembly 102 having two transistors 104-1 and 104-2 that form portions of two RF signal paths 110-1 and 110-2 that have balanced RF power amongst the two paths. The transistors 104-1, 104-2 produce amplified signals that are respectively split and combined in quadrature by two couplers 106 and 108 (with coupler 106 configured as a splitter and coupler 108 configured as a combiner). In particular, the RF power amplifier includes the input coupler 106 (configured as a splitter), first and second printed circuit board (PCB) input matching circuits 112-1 and 112-2, first and second in-package input impedance matching circuits 114-1 and 114-2, first and second transistors 104-1 and 104-2, first and second in-package output impedance matching circuits 120-1 and 120-2, first and second PCB output matching circuits 122-1 and 122-2, and the second coupler 108 (configured as a combiner). In an embodiment, the couplers 106 and 108 are 3 dB hybrid couplers that provide balanced power coupling (e.g., splitting or combining). In an embodiment, the couplers 106 and 108 and transistor assembly 102 are standalone packaged devices that are mounted on a substrate (e.g., a PCB) and the PCB input matching circuits 112-1 and 112-2 and PCB output matching circuits 122-1 and 122-2 are components that may be, for example, integrated into the PCB and/or formed by discrete components (e.g., inductors and capacitors) that are attached to the PCB.

In the example shown in FIG. 1, each transistor 104-1 and 104-2 is shown to include a drain-source capacitance 124-1 and 124-2, Cds. Equivalent circuits of the in-package output impedance matching circuits 120-1 and 120-2 in both RF signal paths 110-1 and 110-2 are shown and include a first inductance 126-1 and 126-2, a second inductance 128-1 and 128-2, a third inductance 130-1 and 130-2 (e.g., shunt inductance), and capacitance 132-1 and 132-2 (e.g., shunt capacitance). An RF power amplifier with the in-package output impedance circuit configured as shown in FIG. 1 can help to control dispersion on the load pull (LP) contours. However, a relatively large capacitor (e.g., greater than 80 picofarads (pF) per side, dependent on frequency of operation) is needed for the shunt capacitor in both in-package output impedance matching circuits. For example, a capacitor on the order of 130 pF is used for the capacitor in both RF signal paths for a total capacitance seen by a modulator of 260 pF coupled to the amplifier output.

Figure 2A:
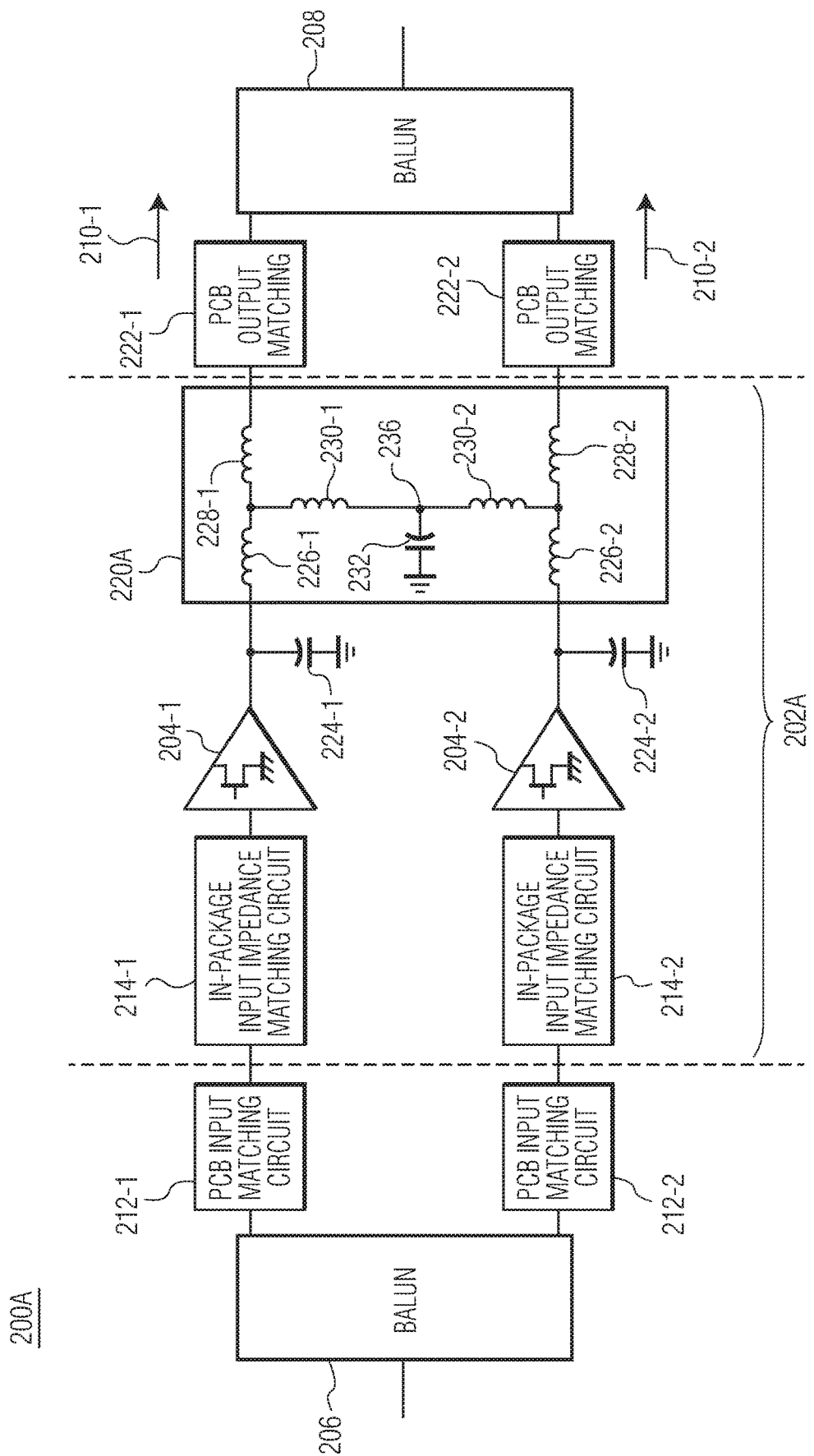
FIG. 2A depicts an embodiment of push-pull RF amplifier that includes an RF transistor assembly combined in a push-pull configuration by two balanced-to-unbalanced transformers (baluns) in which a capacitor is connected in parallel between first and second RF signal paths in accordance with an embodiment of the invention.
Figure 2B:
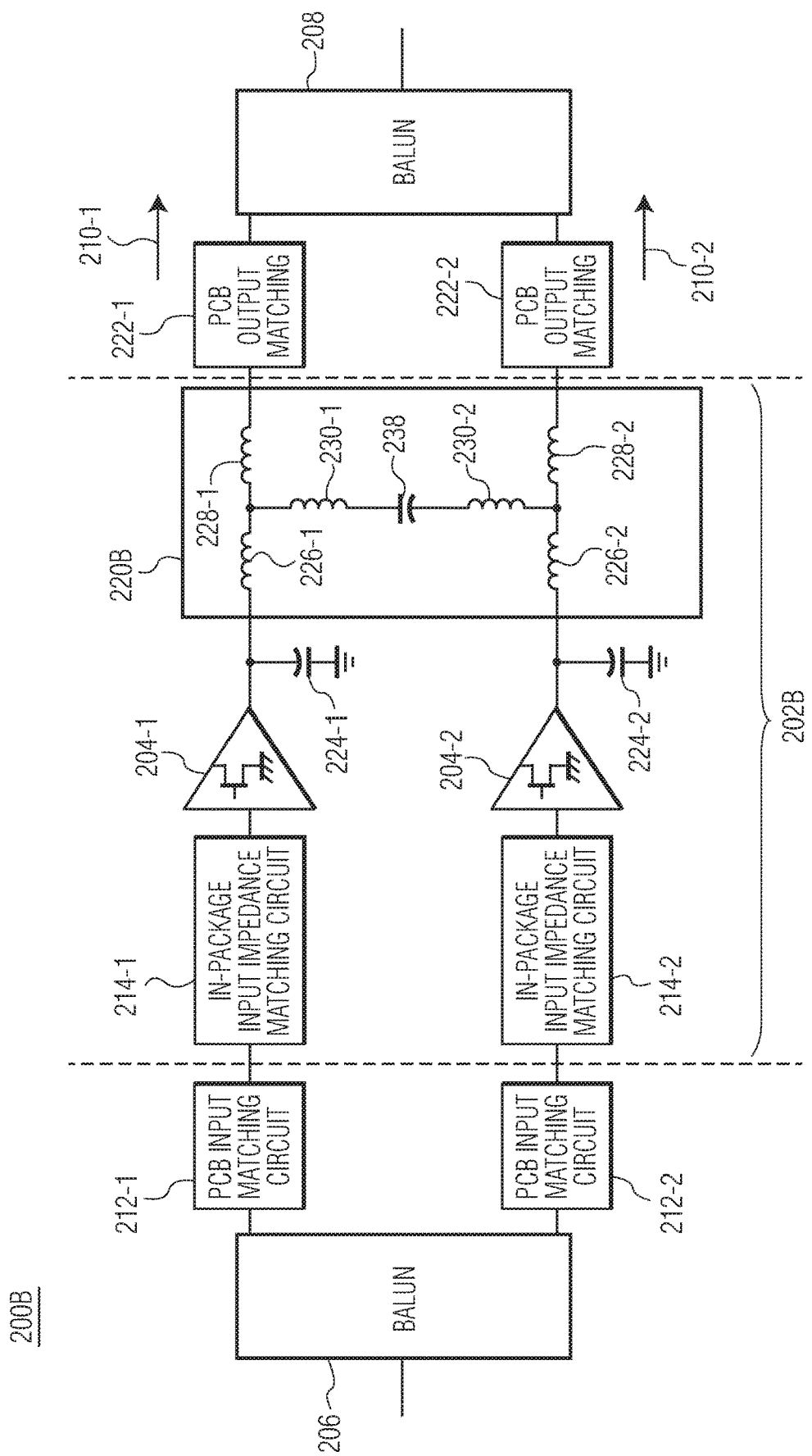
FIG. 2B depicts an embodiment of push-pull RF amplifier that includes an RF transistor assembly combined in a push-pull configuration by two baluns in which a capacitor is connected in series between first and second RF signal path in accordance with an embodiment of the invention.

In a push-pull RF amplifier configuration, only one RF signal path is on (i.e., conducting current from input to output) at a time such that the total capacitance seen by the modulator is only about one-half (e.g., 130 pF), as opposed to the total capacitance (e.g., 260 pF), in the balanced RF amplifier configuration as shown in FIG. 1. Thus, as implemented in various embodiments of the inventive subject matter, the capacitance seen by a modulator coupled to an amplifier output can be reduced by combining two transistors in a push-pull configuration with balanced/unbalanced transformers (referred to as "baluns," e.g., Marchand baluns that impart a 180 degree phase shift) and coupling the two RF signal paths at current conducting terminals (e.g., drains) of the transistors in a manner that shares a common capacitance and combines the inductances associated with the transistors to take advantage of a "virtual ground" that exists in a push-pull transistor configuration. Two examples of push-pull RF amplifiers that include a common capacitance are described with reference to FIGS. 2A and 2B. In contrast to the balanced RF amplifier depicted in FIG. 1, the push-pull RF amplifiers depicted in FIGS. 2A and 2B include a conductive path between the first and second RF signal paths that includes a common capacitance. In the embodiments of FIGS. 2A and 2B, the common capacitance is located on the output side of the transistors and may be connected between the first and second RF signal paths in parallel or connected between the first and second RF signal paths in series. A push-pull RF amplifier configured with a common capacitor can significantly reduce the capacitance seen by a modulator at envelope frequencies while also exhibiting reduced dispersion of the peak power. Additionally, when using a push-pull RF amplifier as described herein, second harmonic power may be roughly 20 dB better in the compression region in the full band and at least 10 dB better than in the balanced configuration.

FIGS. 2A and 2B depict two embodiments of push-pull RF amplifiers 200A and 200B that include an RF transistor assembly 202A and 202B (having two transistors 204-1 and 204-2) combined in a push-pull configuration by two baluns 206 and 208. In the push-pull RF amplifiers depicted in FIGS. 2A and 2B, the first and second RF signal paths 210-1 and 210-2 include a conductive path between an output current conducting terminal (e.g., drain) of the first transistor and an output current conducting terminal (e.g., drain) of the second transistor, and a capacitance, which is electrically connected to the conductive path between a first inductance of the conductive path and a second inductance of the conductive path. In the embodiment of FIG. 2A, the capacitor is connected in parallel between the first and second RF signal paths and in the embodiment of FIG. 2B, the capacitor is connected in series between the first and second RF signal paths. The embodiments of FIGS. 2A and 2B are described below.

With respect to the various embodiments, the transistors 204-1 and 204-2 of the push-pull RF amplifiers 200A and 200B may be field effect transistors (e.g., III-V transistors, such as high electron mobility transistors (HEMTs)), which have a relatively low drain-source capacitance, Cds, when compared with other types of FETs (e.g., a silicon-based, laterally diffused metal oxide semiconductor (LDMOS) FET). In FIGS. 2A and 2B, the drain-source capacitance of the transistors 204-1 and 204-2 is represented with a capacitor 224-1 and 224-2 at the output terminal of the transistors. The capacitors 224-1 and 224-2 depicted in FIGS. 2A and 2B are not physical components, but instead model the parasitic drain-source capacitance of the transistors. According to an embodiment, the transistors may have a drain-source capacitance that is less than about 0.2 picofarads/Watt (pF/W). Further, in some embodiments, the transistors may be GaN FETs, although in other embodiments, the transistors may be another type of III-V transistor (e.g., gallium arsenide (GaAs), gallium phosphide (GaP), indium phosphide (InP), or indium antimonide (InSb)), or another type of transistor that has a relatively low drain-source capacitance.

With reference to FIG. 2A, the push-pull RF amplifier 200A includes the input balun 206 (configured as a splitter), first and second RF signal paths 210-1 and 210-2 that include first and second PCB input matching circuits 212-1 and 212-2 (i.e., input impedance matching circuits implemented on the PCB), first and second in-package input impedance matching circuits 214-1 and 214-2, the first and second transistors 204-1 and 204-2, an in-package output impedance matching circuit 220A, first and second PCB output matching circuits 222-1 and 222-2 (i.e., output impedance matching circuits implemented on the PCB), and an output balun 208 (configured as a combiner). In the embodiment of FIG. 2A, the input balun imparts about a 180 degree phase difference between the two RF signals that are conveyed through the first and second RF signal paths, and the output balun receives the 180 degree out of phase, amplified signals, and recombines the signals in phase. In an embodiment, the baluns 206 and 208 and the transistor assembly 202A are standalone packaged devices that are mounted on a PCB and the PCB input matching circuits 212-1 and 212-2 and PCB output matching circuits 222-1 and 222-2 are components that may be, for example, integrated into the PCB and/or formed by discrete components (e.g., inductors and capacitors) that are attached to the PCB.

In FIGS. 2A and 2B, the vertical dashed lines represent the transition between the PCB and a discrete packaged device that contains the components of the transistor assembly 202A or 202B.

As shown in FIG. 2A, the in-package output impedance matching circuit 220A is modeled as a circuit that includes first inductances 226-1 and 226-2, second inductances 228-1 and 228-2, third inductances 230-1 and 230-2 (e.g., shunt inductance), and capacitance 232 (e.g., shunt capacitance) connected in parallel between the first and second RF signal paths 210-1 and 210-2. In the embodiment of FIG. 2A, there is a node 236 between the third inductances 230-1 and 230-2, "connected in parallel," as used in conjunction with the description of capacitance 232, means that a first terminal of the capacitance 232 is coupled to the node 236, and a second terminal of the capacitance 232 is coupled to a ground reference voltage or terminal of the packaged device.

With reference to FIG. 2B, the push-pull RF amplifier 200B includes an input balun 206 (configured as a splitter), first and second RF signal paths 210-1 and 210-2 that include first and second PCB input matching circuits 212-1 and 212-2 (i.e., input impedance matching circuits implemented on the PCB), first and second in-package input impedance matching circuits 214-1 and 214-2, first and second transistors 204-1 and 204-2, an in-package output impedance matching circuit 220B, first and second PCB output matching circuits 222-1 and 222-2 (i.e., output impedance matching circuits implemented on the PCB), and an output balun 208 (configured as a combiner). In the embodiment of FIG. 2B, the input balun imparts about a 180 degree phase shift between the two RF signals that are output onto the first and second RF signal paths. In an embodiment, the baluns 206 and 208 and the transistor assembly 202B are standalone packaged devices that are mounted on a PCB, and the PCB input matching circuits 212-1 and 212-2 and PCB output matching circuits 222-1 and 222-2 are components that may be, for example, integrated into the PCB and/or formed by discrete components (e.g., inductors and capacitors) that are attached to the PCB.

As shown in FIG. 2B, the in-package output impedance matching circuit 220B is modeled as a circuit that includes first inductances 226-1 and 226-2, second inductances 228-1 and 228-2, third inductances 230-1 and 230-2 (e.g., shunt inductance), and capacitance 238 connected in series between the first and second RF signal paths 210-1 and 210-2. In particular, "connected in series," as used in conjunction with the description of capacitor 238, means that one terminal of the capacitance 238 is connected to the first RF signal path 210-1 and the other terminal of the capacitance 238 is connected to the second RF signal path 210-2.

In operation of either of the two push-pull RF amplifiers 200A and 200B, the input balun 206 splits an incoming RF signal into two components that are phase shifted by about 180 degrees with respect to each other. Because the RF amplifier has a push-pull configuration, when the common capacitance 232 is connected in parallel (FIG. 2A), the effective RF capacitance (e.g., that capacitance that corresponds to either one of the active RF signal paths) is one-half of the quadrature-combined amplifier, but the modulator still sees the entire magnitude of the common capacitance. In an embodiment, the magnitude of the capacitance 232 is much smaller than the magnitude of the capacitance 132-1, 132-2 in FIG. 1. For example, the capacitance 232 may be on the order of 3-20 pF, dependent on operating frequency, and the capacitance 132-1 and 132-2 is on the order of 30-300 pF, also dependent on operating frequency-. When the common capacitance 238 is connected in series (FIG. 2B), the effective RF capacitance is still one-half of the quadrature-combined amplifier, but the modulator (at the envelope frequencies) now sees only the drain-source capacitance, Cds. In an embodiment, the magnitude of the capacitance 238 is much smaller than the magnitude of the capacitance 132-1, 132-2 in FIG. 1. For example, the capacitance 238 may be on the order of 3-20 pF and the capacitance 132-1 and 132-2 is on the order of 30-300 pF. Series connection of the capacitance, as in the embodiment of FIG. 2B, may provide other benefits with respect to an integrated passive device (IPD) standpoint as described below.

The RF amplifier assemblies 202A and 202B of the push-pull RF amplifiers 200A and 200B as depicted in FIGS. 2A and 2B respectively, may be packaged into standalone/discrete devices that are attached and electrically coupled by leads of the packaged device to a substrate (e.g., a PCB) to produce the corresponding push-pull RF amplifiers. Examples of different embodiments of packaged RF amplifiers that may be incorporated into a push-pull RF amplifier are described below with reference to FIGS. 3A-10B.

Figure 3A:
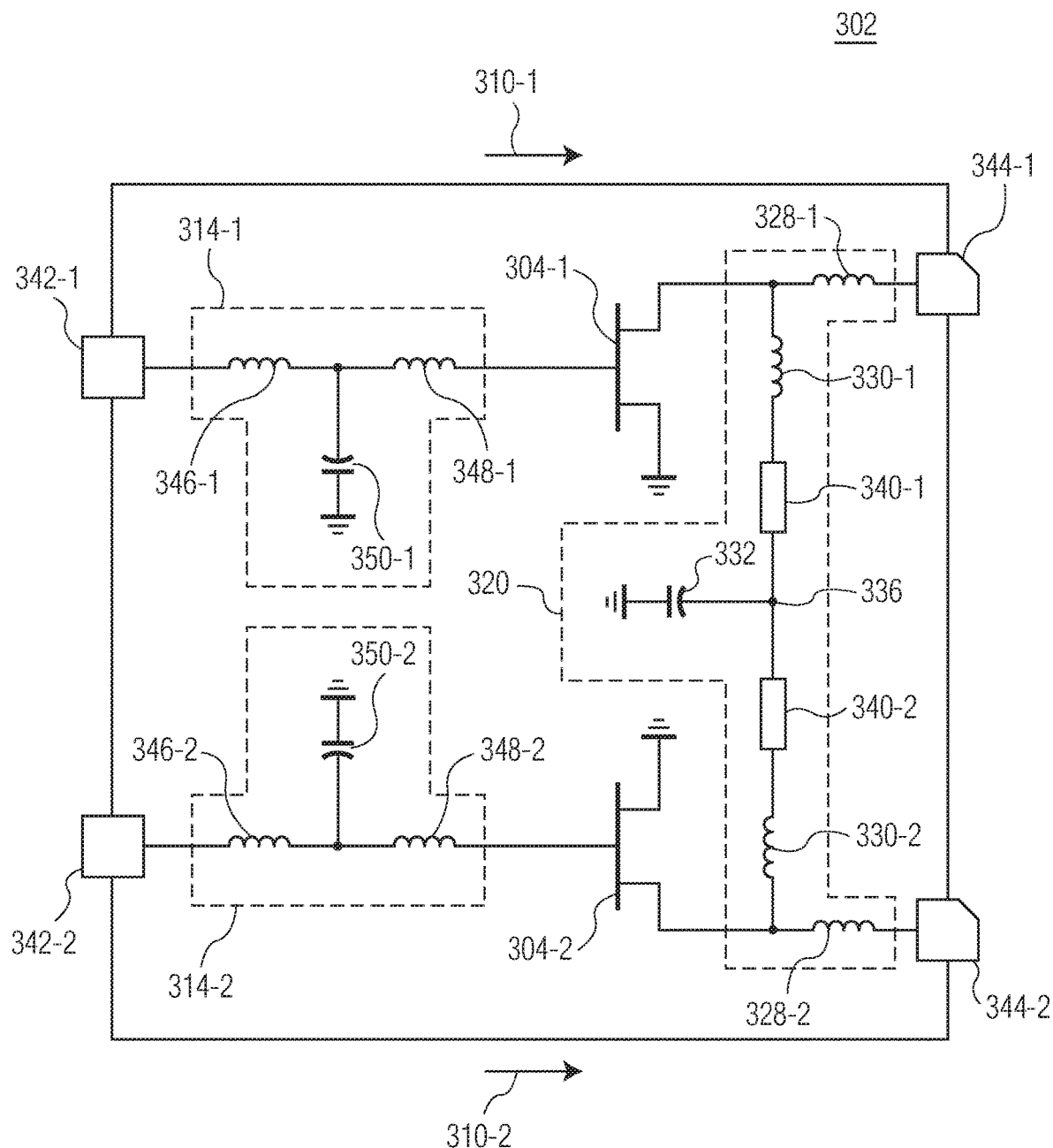
FIGS. 3A and 3B depict circuit-level and component-level layouts of an embodiment of a packaged RF amplifier that includes a common capacitance connected in parallel in accordance with an embodiment of the invention.
Figure 3B:
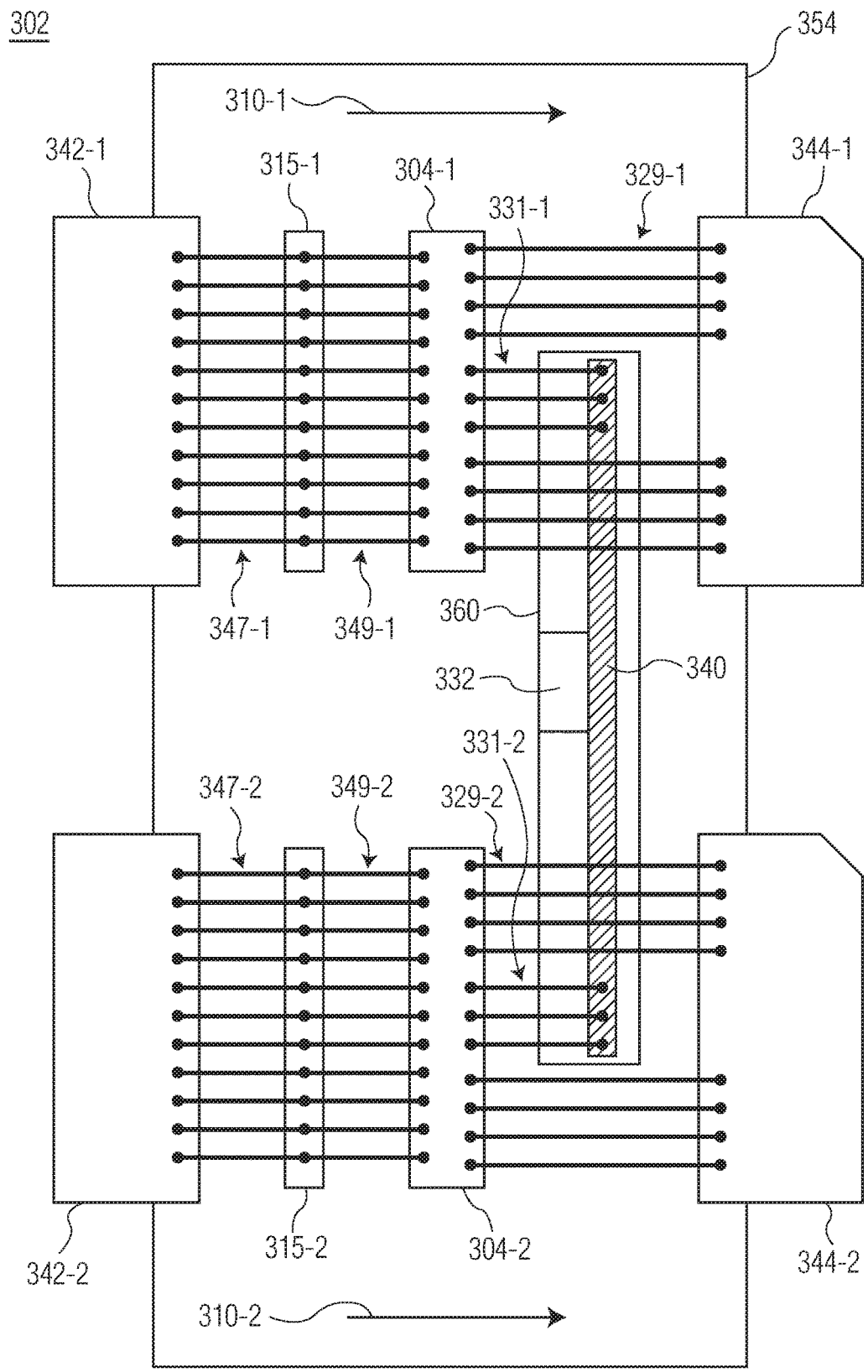

FIGS. 3A and 3B depict an embodiment of a packaged RF amplifier 302 that includes a common capacitance in accordance with an embodiment of the invention. In particular, FIG. 3A depicts a circuit-level layout of a configuration of the packaged RF amplifier and FIG. 3B depicts a corresponding component-level layout of the packaged RF amplifier. As shown in the circuit-level layout of FIG. 3A, a capacitance 332 is electrically connected to an output terminal (e.g., the drain) of both of the transistors 304-1 and 304-2 such that the capacitance is electrically connected to both RF signal paths 310-1 and 310-2, and as shown in the component-level layout of FIG. 3B, a capacitance 332 (e.g., a capacitor) is electrically connected to a microstrip transmission line 340 on the output side (e.g., the drain side) of both of the transistors 304-1 and 304-2 such that the capacitor is common to both RF signal paths. In the embodiment of FIGS. 3A and 3B, the common capacitance is connected to both RF signal paths in parallel.

With reference to FIG. 3A, the first and second RF signal paths 310-1 and 310-2 include (generally from left to right) first and second input leads 342-1 and 342-2, first and second in-package input impedance matching circuits 314-1 and 314-2, first and second transistor devices 304-1 and 304-2, an in-package output impedance matching circuit 320, and first and second output leads 344-1 and 344-2. As shown in FIG. 3A, the first RF signal path 310-1 of the RF amplifier 302 includes the input lead 342-1, the in-package input impedance matching circuit 314-1, the transistor 304-1, the in-package output impedance matching circuit 320, and the output lead 344-1, and the second RF signal path 310-2 of the RF power amplifier device 302 includes the input lead 342-2, the in-package input impedance matching circuit 314-2, the transistor 304-2, the in-package output impedance matching circuit 320, and the output lead 344-2. Although the transistors 304-1 and 304-2 and various elements of the in-package input and output impedance matching circuits 314-1, 314-2, and 320 are shown as singular components, the depiction is for the purpose of ease of explanation only. Those of skill in the art would understand, based on the description herein, that the transistors and/or certain elements of the in-package input and output impedance matching circuits each may be implemented as multiple components (e.g., connected in parallel or in series with each other), and examples of such embodiments are illustrated in the other Figures and described later. Further, the number of input/output leads may not be the same as the number of RF signal paths and/or the number of transistors (e.g., there may be multiple transistors operating in parallel for a given set of input/output lead frames). The description of the transistors 304-1, 304-2 and various elements of the in-package input and output impedance matching circuits 314-1, 314-2, 320, thus are not intended to limit the scope of the inventive subject matter but only to the illustrated embodiments.

Referring to FIG. 3A, the input leads 342-1 and 342-2 and output leads 344-1 and 344-2 of the packaged RF amplifier 302 each include a conductor, which is configured to enable the packaged RF amplifier to be electrically coupled with external circuitry (not shown). More specifically, the input and output leads are physically positioned to span between the exterior and the interior of the device package. The in-package input impedance matching circuits 314-1 and 314-2 are electrically coupled between the input leads 342-1 and 342-2 and a first terminal (or input terminal) of the corresponding transistor 304-1 and 304-2 (e.g., the gate). Similarly, the in-package output impedance matching circuit 320 is electrically coupled between a second terminal of the transistors 304-1 and 304-2 (e.g., the drain terminal) and the output leads 344-1 and 344-2.

According to an embodiment, the transistors 304-1 and 304-2 are the primary active component of the packaged RF amplifier 302. The transistors include a control or input terminal (e.g., a gate terminal) and two current conducting terminals (e.g., source and drain terminals), where the current conducting terminals are spatially and electrically separated by a variable-conductivity channel. For example, the transistors may be field effect transistors (FETs) (as described above with reference to FIGS. 2A and 2B), which each include a gate (control terminal), a drain (a first current conducting terminal), and a source (a second current conducting terminal). For example, the transistors may include GaN HEMTs or silicon LDMOS FETs. Alternatively, the transistors may be bipolar junction transistors (BJTs). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of each of the transistors is coupled to the corresponding in-package input impedance matching circuit 314-1 and 314-2, the drain of each of the transistors is coupled to the in-package output impedance matching circuit 320, and the source of each of the transistors is coupled to ground (or another voltage reference). Through the variation of control signals provided to the gate of the transistors, the current between the current conducting terminals of the transistors may be modulated.

The below-provided description is provided with regard to the first RF signal path 310-1 as depicted in FIG. 3A although the description applies as well to the second RF signal path 310-2 as depicted in FIG. 3A. With reference to the first RF signal path, the in-package input impedance matching circuit 314-1 is coupled between the input lead 342-1 and the control terminal (e.g., gate) of the transistor 304-1. The in-package input impedance matching circuit 314-1 is configured to raise the impedance of the packaged RF amplifier 302 to a higher (e.g., intermediate or higher) impedance level (e.g., in a range from about 2 to about 10 Ohms or higher). This can be advantageous in that it allows the printed circuit board level (PCB-level) matching interface from a driver stage to have an impedance that can be achieved in high-volume manufacturing with minimal loss and variation (e.g., a "user friendly" matching interface). In the embodiment of FIG. 3A, the in-package input impedance matching circuit 314-1 includes first and second inductive elements 346-1 and 348-1 (e.g., two sets of bond wires 347-1, 349-1, FIG. 3B) and a shunt capacitor 350-1 (e.g., capacitor 315-1, FIG. 3B). The first inductive element 346-1 (e.g., a first set of bond wires) is coupled between the input lead 342-1 and a first terminal of the capacitor 350-1, and the second inductive element 348-1 (e.g., a second set of bond wires) is coupled between the first terminal of capacitance 350-1 and the control terminal of transistor 304-1. The second terminal of capacitance 350-1 is coupled to ground (or another voltage reference). The combination of the inductive elements 346-1 and 348-1 and the shunt capacitor 350-1 functions as a low-pass filter. According to an embodiment, the series combination of inductive elements 346-1 and 348-1 may have a value in a range between about 50 picohenries (pH) to about 3 nanohenries (nH), and the shunt capacitor 350-1 may have a value in a range between about 5 picofarads (pF) to about 80 pF, although the inductance value may be lower or higher, as well.

The in-package output impedance matching circuit 320 is coupled between both the first and second RF signal paths 310-1 and 310-2. In particular, the in-package output impedance matching circuit is coupled between the first current conducting terminal (e.g., drain) of the transistor 304-1 and the output lead 344-1 in the first RF signal path 310-1 and between the first current conducting terminal (e.g., drain) of the transistor 304-2 and the output lead 344-2 in the second RF signal path 310-2. The in-package output impedance matching circuit 320 is configured to match the output impedance of the packaged RF amplifier 302 with the input impedance of an external circuit or component (not shown) that may be coupled to the output leads 344-1 and 344-2. According to an embodiment, the in-package output impedance matching circuit 320 includes first inductive elements 328-1 and 328-2, second inductive elements 330-1 and 330-2 (e.g., shunt inductance), and a common (or shared) capacitance 332. The capacitance 332 may be referred to herein as the "shunt" capacitance, or Cshunt. The first inductive elements 328-1 and 328-2 (e.g., two sets of parallel bondwires 329-1, 329-2, FIG. 3B), which may be referred to herein as a "series inductor" or $L_{series}$, are coupled between the first current conducting terminals (e.g., the drain) of the transistors 304-1 and 304-2 and the corresponding output leads 344-1 and 344-2. The second inductive elements 330-1 and 330-2 (e.g., two sets of parallel bondwires 331-1, 331-2, FIG. 3B), which may be referred to herein as a "shunt inductor" or $L_{shunt}$, are coupled between the first current conducting terminals (e.g., the drain) of the transistors 304-1 and 304-2 and the shunt capacitance 332. As is described below with reference to FIG. 3B, the transistors are connected to the capacitance by a microstrip transmission line, portions of which are represented in FIG. 3A by elements 340-1 and 340-2.

As is described in more detail below, various embodiments of the packaged RF amplifier 302 may include at least one integrated passive device (IPD) that forms all or a portion of the in-package input impedance matching circuits 314-1 and 314-2 and/or the in-package output impedance matching circuit 320. In an embodiment, each IPD includes a semiconductor substrate and one or more integrated passive components and/or passive components coupled to the semiconductor substrate. In a particular embodiment, each IPD may include a shunt capacitance, and in some embodiments, a shunt inductance. In other embodiments, some or all of the portions of the in-package input impedance matching circuits and/or the in-package output impedance matching circuit may be implemented as distinct/discrete components or as portions of other types of assemblies (e.g., a silicon based passive circuit, a low-temperature co-fired ceramic (LTCC) device, a small PCB assembly, and so on). In still other embodiments, some or all of the portions of the in-package input impedance matching circuits and/or the in-package output impedance matching circuit may be coupled to and/or integrated within the semiconductor die that includes the corresponding transistor or transistors. The below, detailed description of embodiments that include IPD assemblies should not be taken to limit the inventive subject matter, and the term "passive device substrate" means any type of structure that includes a passive device, including an IPD, a LTCC device, a transistor die, a PCB assembly, and so on.

With reference to FIG. 3B, the packaged RF amplifier 302 includes a flange 354 (or "device substrate"), upon which the other components are attached, and which may provide a ground reference node for the amplifier 302. The first RF signal path 310-1 includes an input lead 342-1 (e.g., input lead 342-1, FIG. 3A), an input impedance matching circuit (e.g., the in-package input impedance matching circuit 314-1, FIG. 3A), which includes first and second sets of wirebonds 347-1, 349-1 (e.g., inductances 346-1, 348-1, FIG. 3A), and an input IPD 315-1 (including capacitance 350-1, FIG. 3A), a transistor 304-1 (e.g., transistor 304-1, FIG. 3A), an output impedance matching circuit (e.g., the in-package output impedance matching circuit 320, FIG. 3A), which includes third and fourth sets of wirebonds 329-1, 331-1 (e.g., inductances 328-1, 330-1, FIG. 3A), a transmission line inductance 340 (e.g., inductance 340-1, FIG. 3A), and an output IPD 360 (including capacitor 332, FIG. 3A). The first RF signal path 310-1 also includes an output lead 344-1 (e.g., the output lead 344-1, FIG. 3A). The second RF signal path includes an input lead 342-2 (e.g., input lead 342-2, FIG. 3A), an input impedance matching circuit (e.g., the in-package input impedance matching circuit 314-2, FIG. 3A), which includes fifth and sixth sets of wirebonds 347-2, 349-2 (e.g., inductances 346-2, 348-2, FIG. 3A), and an output IPD 315-2 (including capacitance 350-2, FIG. 3A), a transistor 304-2 (e.g., transistor 304-2, FIG. 3A), the output impedance matching circuit (e.g., the in-package output impedance matching circuit 320, FIG. 3A), which includes seventh and eighth sets of wirebonds 329-2, 331-2 (e.g., inductances 328-2, 330-2, FIG. 3A), a transmission line inductance 340 (e.g., inductance 340-2, FIG. 3A), and the output IPD 360 (including capacitor 332, FIG. 3A). The second RF signal path 310-2 also includes an output lead 344-2 (e.g., the output lead 344-2, FIG. 3A). All of the above-listed components may be packaged together as parts of the packaged RF amplifier. In the example packaged RF amplifier 302 of FIG. 3B, the two RF signal paths 310-1 and 310-2 essentially function in parallel, although another semiconductor device may include more than two RF signal paths. The output IPD 360 includes the microstrip transmission line 340 (e.g., a conductive strip) that extends between the drain side of both transistors 304-1 and 304-2 of the two RF signal paths, and the drain side of both transistors is electrically connected to the microstrip transmission line via bond wires 331-1 and 331-2, which correspond to the inductances 330-1, and 330-2, respectively, as described with reference to FIG. 3A. More specifically, a first end of the microstrip transmission line 340 is connected to bondwires 331-1, and a second end of the microstrip transmission line 340 is connected to bondwires 331-2. A capacitor 332 is connected in parallel to a point along the microstrip transmission line 340 between the two ends, and that connection point corresponds to node 336, FIG. 3A. More specifically, a first portion of the microstrip transmission line 340 between the connection point and bondwires 331-1 corresponds to inductance 340-1 (FIG. 3A), and a second portion of the microstrip transmission line 340 between the connection point and bondwires 331-2 corresponds to inductance 340-2 (FIG. 3A). Capacitor 332 may be, for example, a metal-insulator-metal (MIM) capacitor that is integrally formed within IPD 360, although capacitor 332 may be implemented using other technologies, as well. More specifically, a first terminal of capacitor 332 is electrically connected to the microstrip transmission line 340, and a second terminal of capacitor 332 is electrically connected to a ground reference node (e.g., to flange 354 with conductive through substrate vias (TSVs) that extend from the second terminal to the bottom surface of the IPD 360). In other embodiments, capacitor 332 may be implemented with multiple MIM or other types of capacitors coupled in parallel between microstrip transmission line 340 and the ground reference node (e.g., flange 354). The components of the packaged RF amplifier may be attached to the flange 354 (e.g., a conductive metal substrate) and electrically connected to each other by bondwires, including, for example, sets of parallel bondwires. For purposes of clarity, the input leads, the input IPDs, the transistors, the output IPD, and the output leads each may be referred to in the singular sense, below, as will analogous components in other, later-described Figures. It is to be understood that the description of a particular device component in the singular sense applies to the set of all such components.

As shown in FIG. 3B, the components of the packaged RF amplifier 302 device are electrically connected by conductive bondwires 347-1, 347-2, 349-1, 349-2, 329-1, 329-2, 331-1, and 331-2 (referred to herein simply as bondwires) as is known in the field. For example, with regard to the first RF signal path 310-1 (a similar description applies also to the second RF signal path), multiple parallel bondwires 347-1 are connected between the input lead 342-1 and the input IPD 315-1, multiple parallel bondwires 349-1 are connected between the input IPD 315-1 and the transistor 304-1 (e.g., the gate of the transistor), and multiple bondwires 329-1 are connected between the transistor 304-1 (e.g., the drain of the transistor) and the output lead 344-1. Additionally, multiple bondwires 331-1 are connected between the transistor 304-1 (e.g., the drain of the transistor) and the microstrip transmission line 340 of the output IPD 360. As shown in the example of FIG. 3B, eight bondwires 329-1 are connected in parallel between the transistor 304-1 and the output lead 344-1 and three bondwires 331-1 are connected between the transistor 304-1 and the microstrip transmission line 340 of the output IPD 360. The bondwires correspond to inductive elements as indicated in the circuit-level layout of FIG. 3A.

According to an embodiment, the packaged RF amplifier 302 is incorporated in an air cavity package, in which the transistors 304-1 and 304-2 and the in-package input and output impedance matching circuits 314-1, 314-2, 320 are located within an enclosed air cavity. Basically, as will be described in more detail below, the air cavity is bounded by the flange 354, an isolation structure (not shown), and a cap (not shown) overlying and in contact with the isolation structure and the input/output leads 342-1, 342-2, 344-1, and 344-2. In other embodiments, the RF amplifier device may be incorporated into an over-molded package (i.e., a package in which the electrical components within the active device area are encapsulated with a non-conductive molding compound, and in which portions of the leads, and all or portions of the isolation structure also may be encompassed by the molding compound).

In an embodiment, the flange 354 includes a rigid electrically-conductive substrate, which has a thickness that is sufficient to provide structural support for electrical components and elements of the RF amplifier device 302. In addition, the flange may function as a heat sink for the transistors 304-1 and 304-2 and other devices mounted on the flange. In an embodiment, the flange has a top and bottom surface (only a top surface is visible in the figures), and a substantially-rectangular perimeter that corresponds to the perimeter of the device. In an embodiment, the flange is formed from a conductive material, and may be used to provide a ground reference for the device. For example, various components and elements may have terminals that are electrically coupled to the flange, and the flange may be electrically coupled to a system ground when the device is incorporated into a larger electrical system. At least the surface of the flange is formed from a layer of conductive material, and possibly all of the flange is formed from bulk conductive material. Alternatively, the flange may have one or more layers of non-conductive material below its top surface. Either way, the flange has a conductive top surface. The flange may more generally be referred to as a substrate or a PCB with a conductive surface.

As mentioned above, in an embodiment, an isolation structure (not shown) may be attached to the top surface of the flange 354. The isolation structure is formed from a rigid, electrically insulating material, and functions to electrically isolate the leads 342-1, 342-2, 344-1, 344-2 from the flange 354. The term "isolation structure," as used herein, refers to a structure that provides electrical isolation between conductive features of a device (e.g., between the leads, and the flange). The leads (e.g., leads 342-1, 342-2, 344-1, 344-2) may be coupled to the top surface of the isolation structure (e.g., using epoxy or other adhesive materials), and the bottom surface of the isolation structure may be coupled to the flange (e.g., using epoxy or other adhesive materials). In an embodiment, the isolation structure has a frame shape, which includes a central opening.

In an embodiment, the input and output leads 342-1, 342-2, 344-1, and 344-2 are mounted on a top surface of the isolation structure on opposed sides of a central opening, and thus the input and output leads are elevated above the top surface of the flange 354, and are electrically isolated from the flange. For example, the input and output leads may be soldered or otherwise attached to metallization on a top surface of the isolation structure. Generally, the input and output leads are oriented in order to allow for attachment of the bondwires between the input and output leads and components and elements within the central opening of isolation structure.

As described above, the transistors 304-1 and 304-2 and various elements of the in-package input IPDs 315-1 and 315-2 and the output IPD 360 are mounted on a generally central portion of the top surface of a flange 354 that is exposed through an opening in the isolation structure. According to an embodiment, the transistors are positioned within an active device area of packaged RF amplifier device 302, along with the input and output IPDs. For example, the input IPDs, the transistors, and the output IPDs may be coupled to the flange using conductive epoxy, solder, solder bumps, sintering, and/or eutectic bonds.

The transistors 304-1 and 304-2 may be GaN-based transistors, in some embodiments, or silicon-based transistors, in other embodiments. Each transistor has a control terminal (e.g., a gate) and two current conducting terminals (e.g., a drain and a source). The control terminal of each transistor is coupled to the corresponding in-package input impedance matching circuit 314-1 and 314-2. In addition, one current conducting terminal (e.g., the drain) is coupled to the in-package output impedance matching circuit 320 and to the corresponding output lead 344-1 and 344-2. The other current conducting terminal (e.g., the source) is coupled to the flange (e.g., to ground), in an embodiment.

As described above with reference to FIGS. 3A and 3B, the common capacitance 332 is connected in parallel between the first and second RF signal paths 310-1 and 310-2. Various other example embodiments of a packaged RF amplifier with common capacitance are described below with reference to FIGS. 4A-10B. Throughout the description of FIGS. 3A-10B, similar reference numbers may be used to refer to similar elements.

Figure 4A:
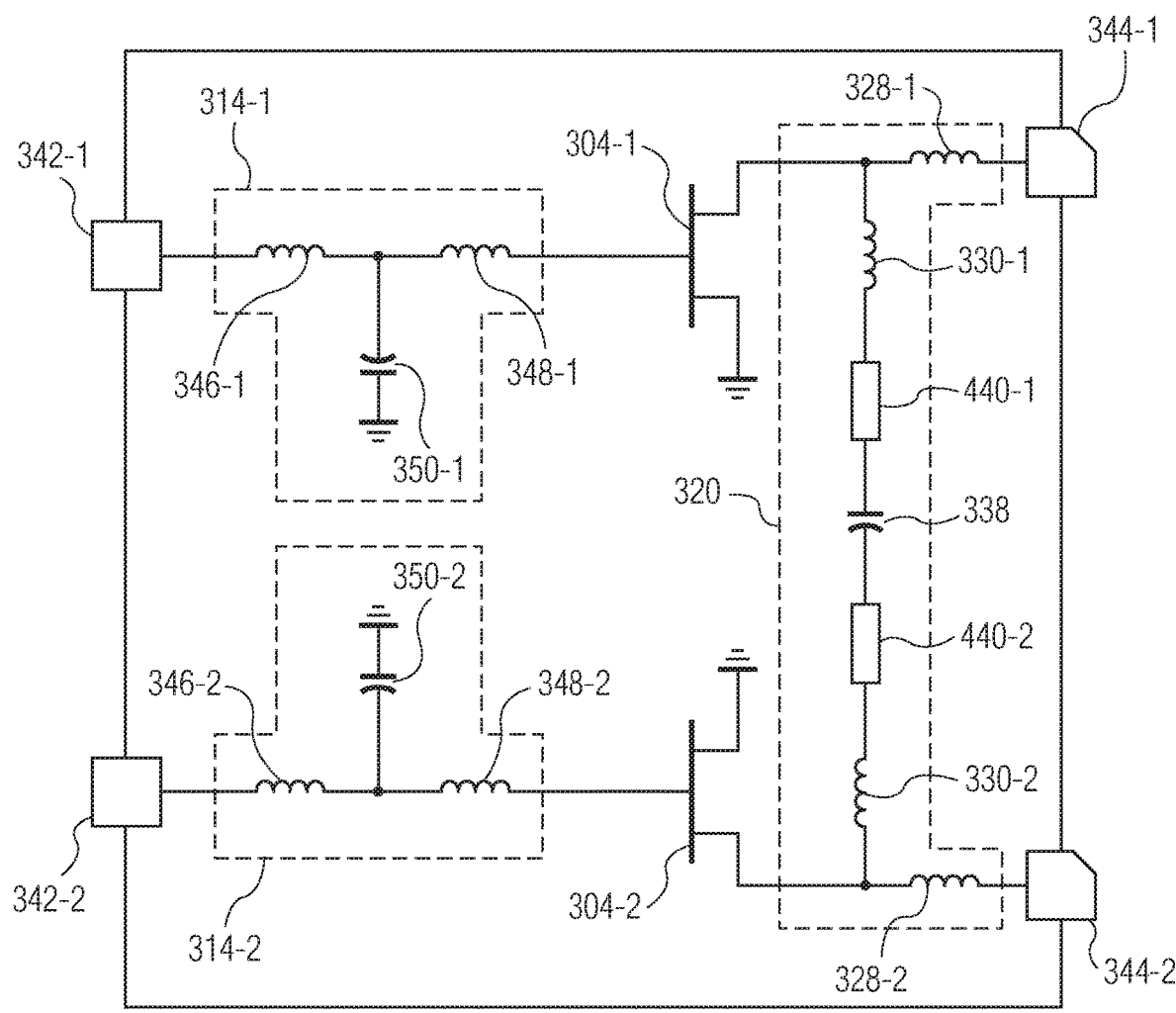
FIGS. 4A and 4B depict circuit-level and component-level layouts of an embodiment of a packaged RF amplifier that includes a common capacitance connected in series in accordance with an embodiment of the invention.
Figure 4B:
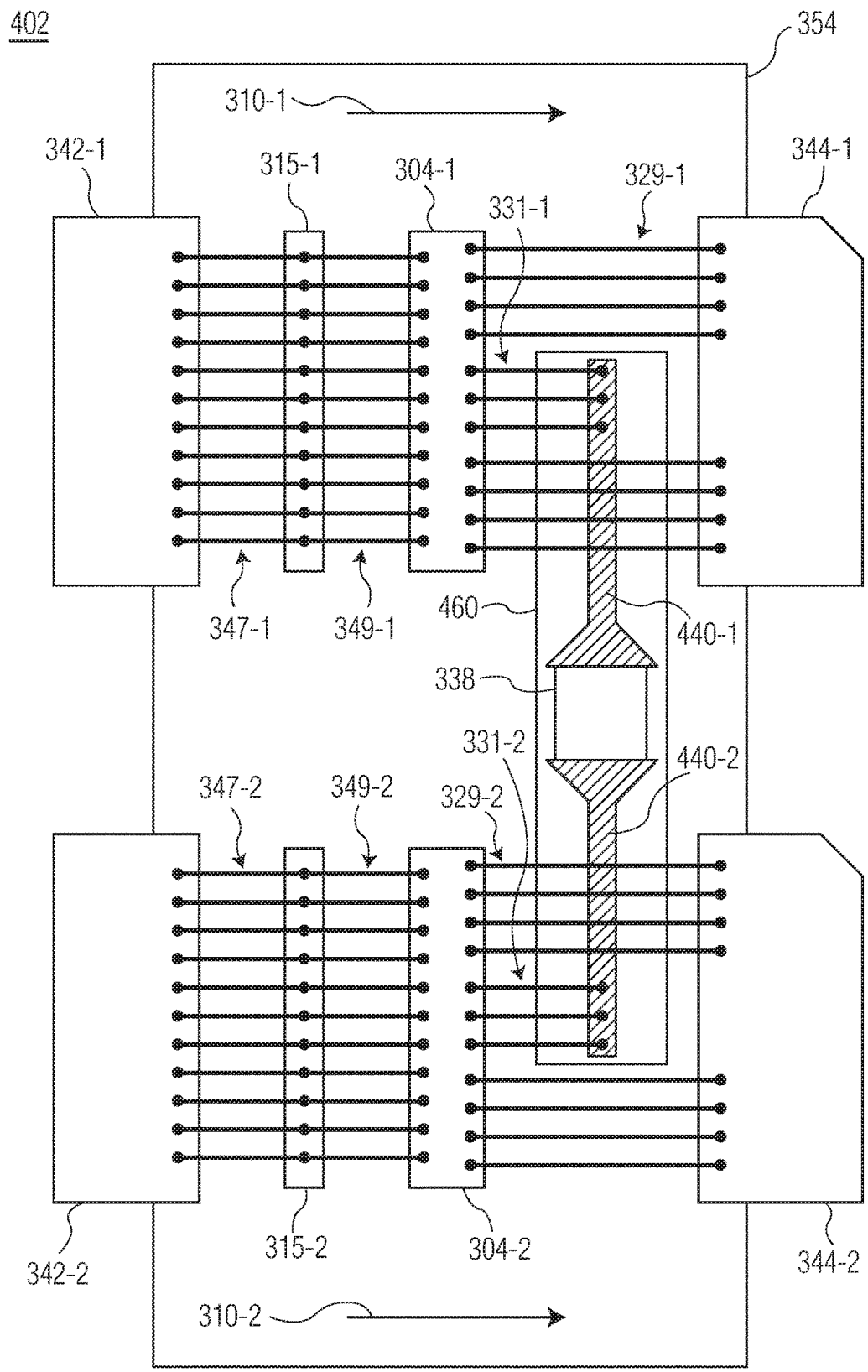

In another embodiment, the common capacitance is connected in series between the first and second RF signal paths. FIGS. 4A and 4B depict an embodiment of a packaged RF amplifier 402 in which a common capacitance 338 (e.g., capacitance 238, FIG. 2B) is connected in series between the first and second RF signal paths 310-1 and 310-2 in accordance with an embodiment of the invention. In particular, FIG. 4A depicts a circuit-level layout of a configuration of a packaged RF amplifier, and FIG. 4B depicts a corresponding component-level layout of the packaged RF amplifier.

With reference to the circuit-level layout of FIG. 4A, capacitance 338 is electrically connected to the output terminal (e.g., the drain terminal) of both of the transistors 304-1 and 304-2 such that the capacitance is electrically connected to both RF signal paths in series. As depicted in FIG. 4A, one terminal of the capacitance 338 is connected to the first RF signal path 310-1, and the other terminal of the capacitance 338 is connected to the second RF signal path 310-2.

With reference to the component-level layout of FIG. 4B, the packaged RF amplifier 402 includes an output IPD 460 that includes a first microstrip transmission line 440-1 (e.g., inductance 440-1, FIG. 4A), a second microstrip transmission line 440-2 (e.g., inductance 440-2, FIG. 4A), and a capacitor 338. The capacitor 338 is electrically connected in series between the outputs (e.g., drain terminals) of transistors 304-1 and 304-2 as follows. A first terminal of capacitor 338 is electrically connected to a first end of transmission line 440-1, and a second end of transmission line 440-1 is electrically connected to the output terminal of transistor 304-1 through wirebonds 331-1. A second terminal of capacitor 338 is electrically connected to a first end of transmission line 440-2, and a second end of transmission line 440-2 is electrically connected to the output terminal of transistor 304-2 through wirebonds 331-2.

Capacitor 338 may be, for example, a MIM capacitor that is integrally formed within IPD 460, although capacitor 338 may be implemented using other technologies, as well. More specifically, a first terminal of capacitor 338 is electrically connected to the microstrip transmission line 440-1, and a second terminal of capacitor 338 is electrically connected to microstrip transmission line 440-2, as mentioned above. In other embodiments, capacitor 338 may be implemented with multiple MIM or other types of capacitors coupled in parallel between microstrip transmission lines 440-1, 440-2.

In an embodiment, series-connected capacitance in an IPD does not need to have TSVs, which can reduce component cost by avoiding TSV processing steps during fabrication. Additionally, the lack of TSVs may enable the thickness of a capacitor to be increased. For example, the transmission line Q factor may be significantly improved. Additionally, with no TSVs, the output IPD, which may be a relatively large component, may be less likely to experience micro-cracks during manufacturing, assembly and/or during temperature excursions while in use.

Figure 5A:
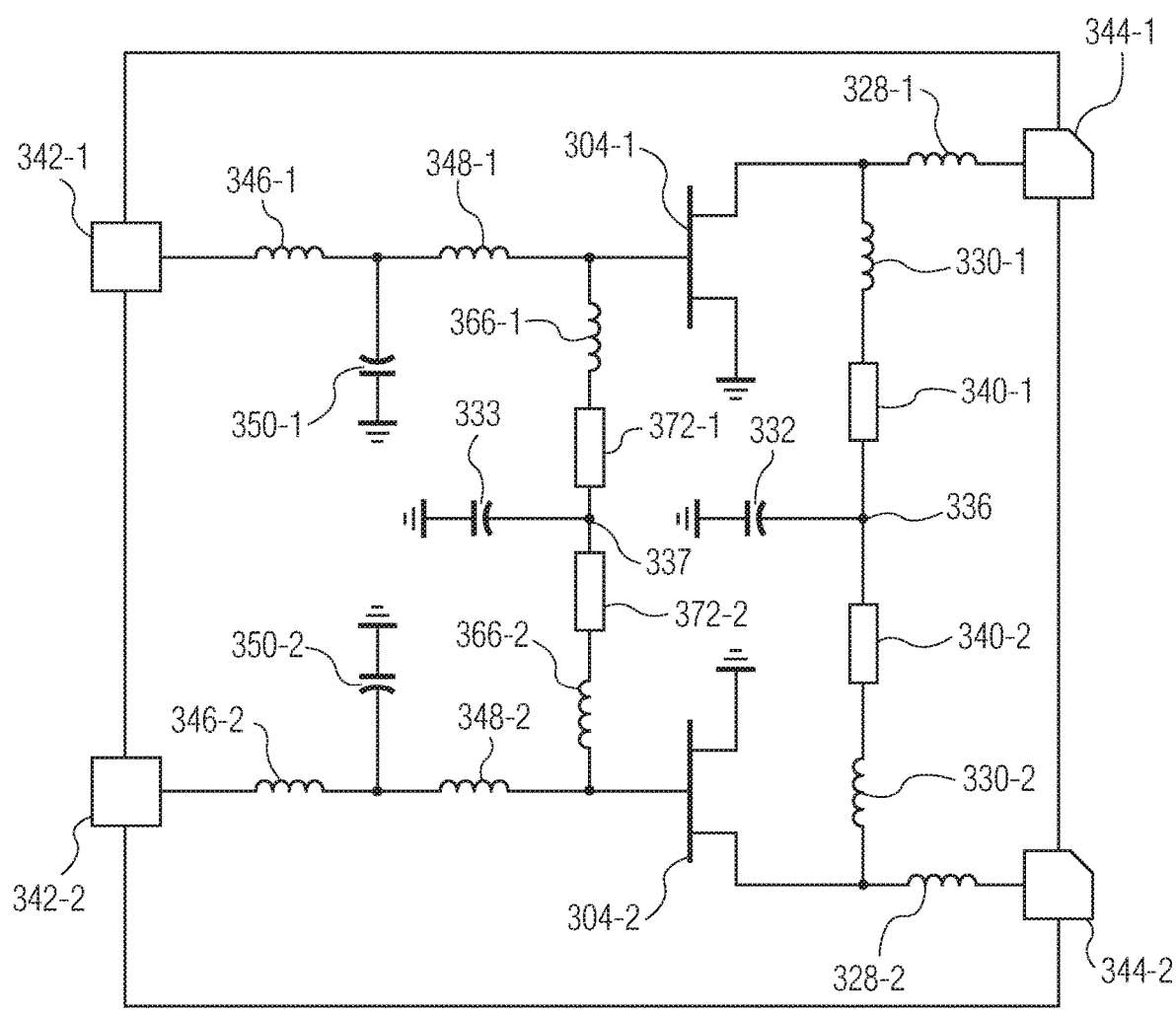
FIGS. 5A and 5B depict circuit-level and component-level layouts of an embodiment of a packaged RF amplifier that includes a common capacitance connected in parallel at the input and the output of transistors in accordance with an embodiment of the invention.
Figure 5B:
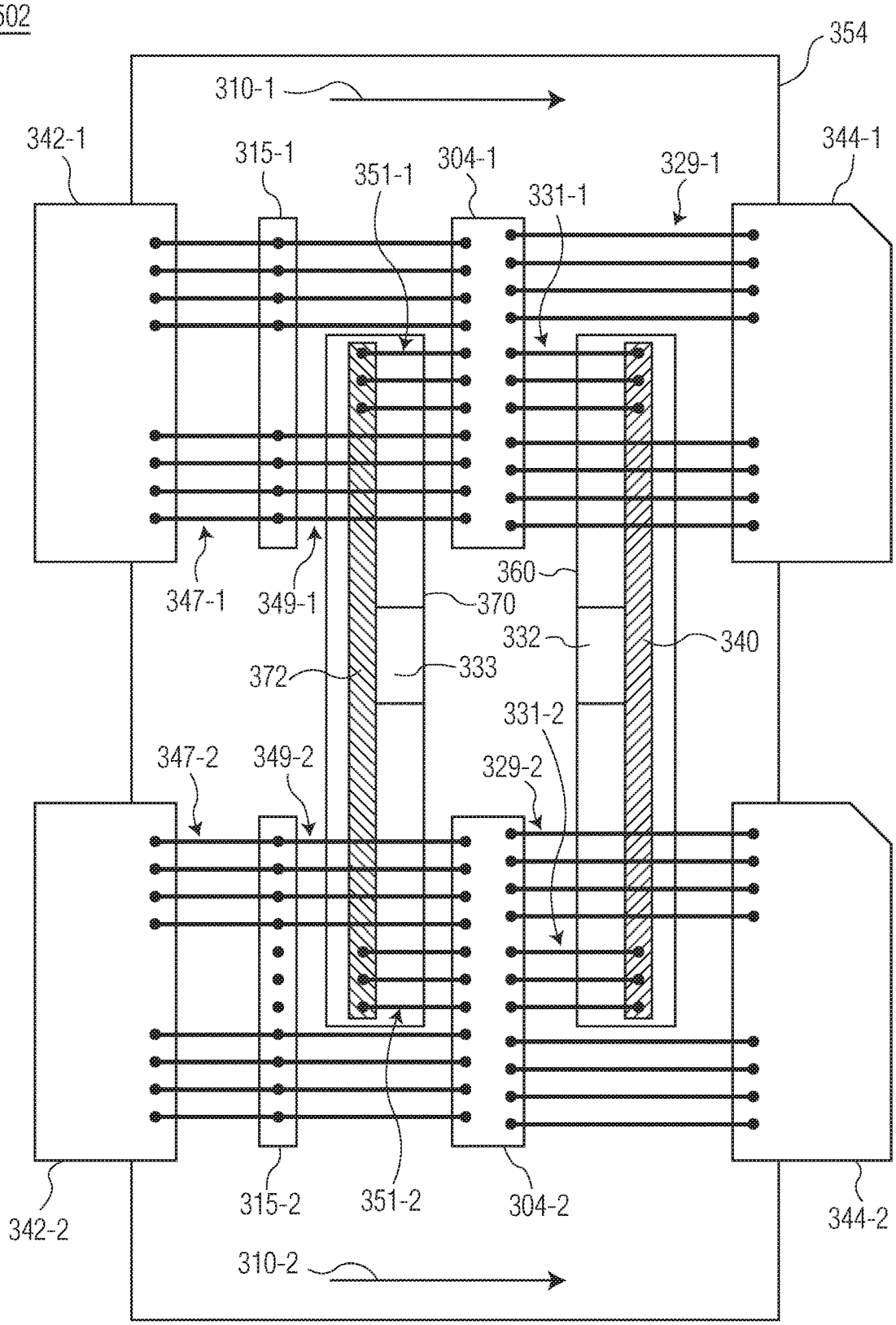

In an embodiment, common capacitance is connected at the input side of the transistors as well as at the output side of the transistors. FIGS. 5A and 5B depict an embodiment of a packaged RF amplifier 502 in which common capacitance is connected at the input side of the transistors 304-1 and 304-2 as well as at the output side of the transistors in accordance with an embodiment of the invention. In particular, FIG. 5A depicts a circuit-level layout of a configuration of a packaged RF amplifier and FIG. 5B depicts a corresponding component-level layout of the packaged RF amplifier. Such a configuration can enable even-order harmonic termination.

With reference to the circuit-level layout of FIG. 5A, a first capacitance 332 is electrically connected in parallel to the drain of both of the transistors 304-1 and 304-2 such that the first capacitance is electrically connected to both RF signal paths 310-1 and 310-2 and a second capacitance 333 is electrically connected in parallel to the gate of both of the transistors such that the second capacitance is electrically connected between both RF signal paths. As depicted in FIG. 5A, on the output side there is a node 336 between the inductances 330-1 and 330-2 and a first terminal of the first capacitance 336 is coupled to the node 336 and a second terminal of the first capacitance is coupled to ground. Additionally, on the input side there is a node 337 between the inductances 366-1 and 366-2 and a first terminal of the second capacitance is coupled to the node 337 and a second terminal of the second capacitance is coupled to ground.

With reference to the component-level layout of FIG. 5B, the packaged RF amplifier 502 includes an output IPD 360 that includes a first microstrip transmission line 340 and a first capacitor 332 connected to the first microstrip transmission line in parallel and an input IPD 370 that includes a second microstrip transmission line 372 and a second capacitor 332 connected to the second microstrip transmission line parallel. In FIG. 5B, bondwires 351-1 and 351-2 connect the IPD 370 to the transistors 304-1 and 304-2 and correspond to inductance 366-1 and 366-2, FIG. 5A. Additionally, microstrip transmission line 372 in FIG. 5B corresponds to transmission line inductance 340 (e.g., a microstrip transmission line) corresponds to elements 372-1 and 372-2 in FIG. 5A.

Figure 6A:
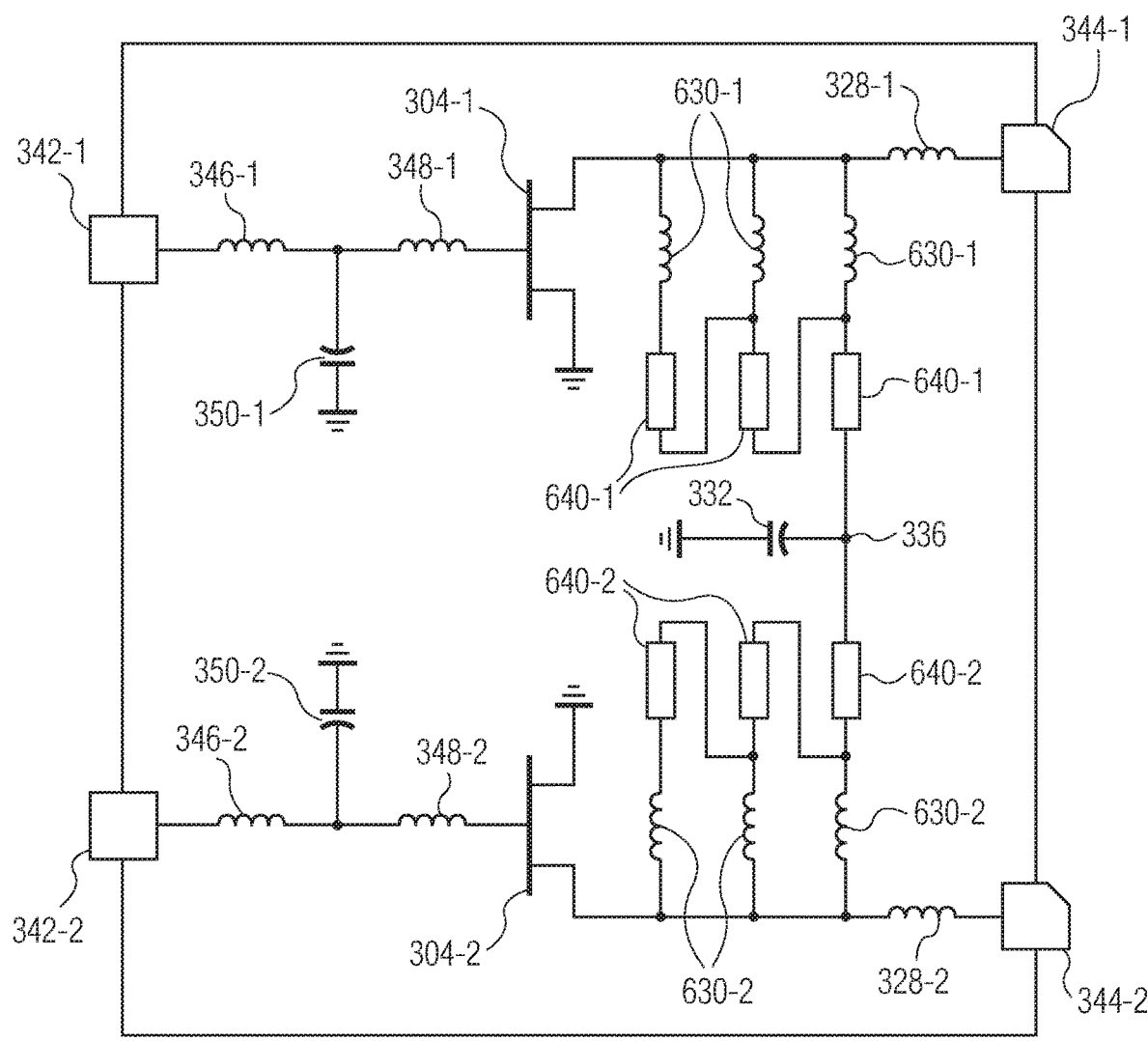
FIGS. 6A and 6B depict circuit-level and component-level layouts of an embodiment of a packaged RF amplifier that includes a common capacitance connected in parallel with a differential shunt in accordance with an embodiment of the invention.
Figure 6B:
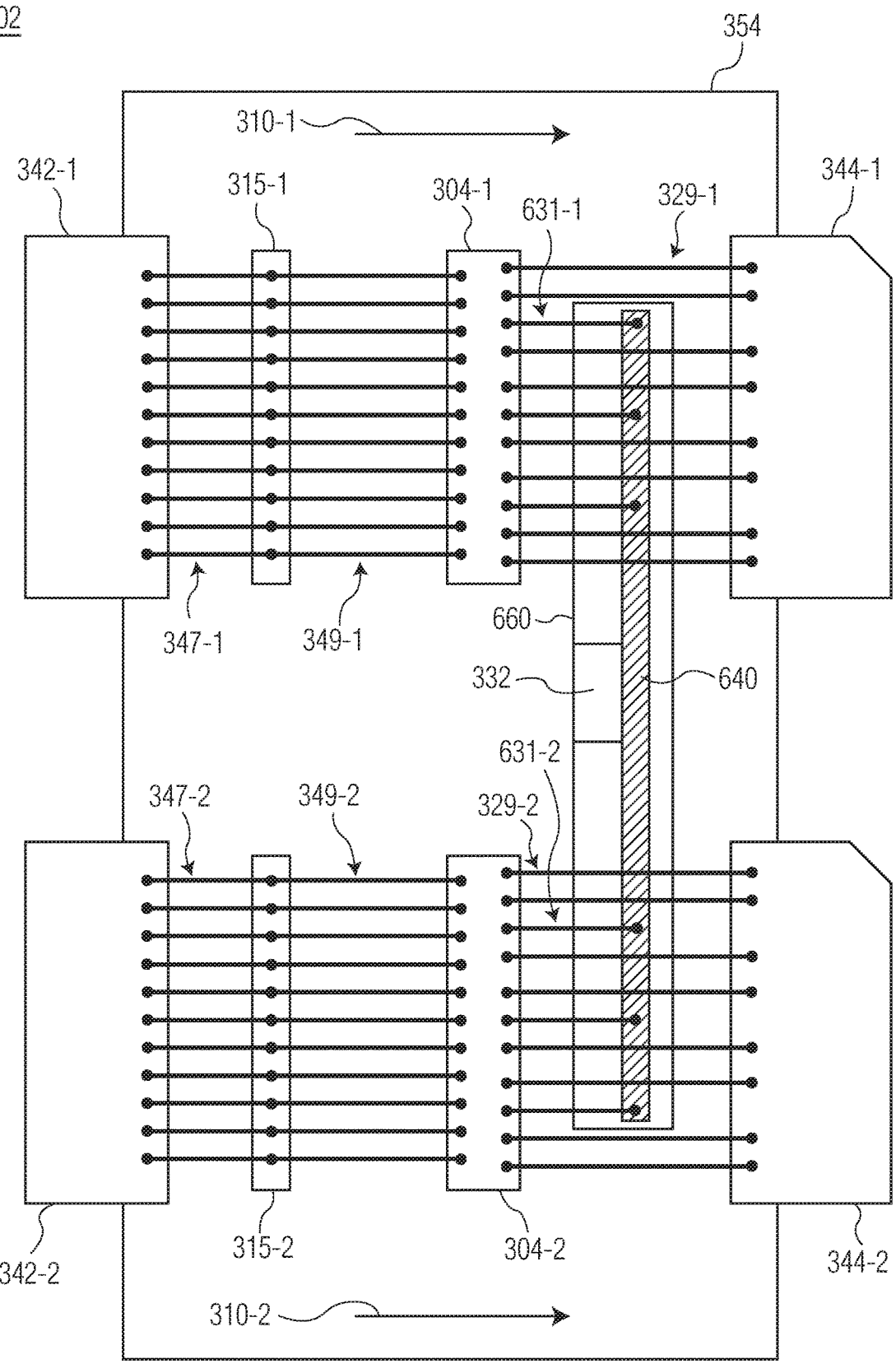

In an embodiment, the common capacitance is connected in parallel between the first and second RF signal paths in a spread shunt inductance configuration. FIGS. 6A and 6B depict an embodiment of a packaged RF amplifier 602 in which the common capacitance is connected in parallel in a spread shunt inductance configuration in accordance with an embodiment of the invention. In particular, FIG. 6A depicts a circuit-level layout of a configuration of a packaged RF amplifier and FIG. 6B depicts a corresponding component-level layout of the packaged RF amplifier.

With reference to the circuit-level layout of FIG. 6A, capacitance 332 is electrically connected to the drain of both of the transistors 304-1 and 304-2 such that the capacitance is electrically connected to both RF signal paths 310-1 and 310-2 in parallel and the shunt inductance is divided into three inductances 630-1 each corresponding to a portion of the microstrip transmission line, which portions are represented in FIG. 6A by elements 640-1. As depicted in FIG. 6A, node 336 is between the shunt inductances 630-1 of the first RF signal path 310-1 and the shunt inductances 330-2 of the second RF signal path 310-2 and a first terminal of the capacitance 332 is coupled to the node 336 and a second terminal of the capacitance 332 is coupled to ground.

With reference to the component-level layout of FIG. 6B, the packaged RF amplifier 602 includes the output IPD 660 that has microstrip transmission line 640 and capacitor 332 connected in parallel to the microstrip transmission line. As depicted in FIG. 6B, the drain of the first transistor 304-1 is electrically connected to the microstrip transmission line 640 by a first set of parallel bondwires 631-1 that are separated from each other by bondwires 329-1 that electrically connect the drain of the first transistor to the first output lead 344-1 and the drain of the second transistor 304-2 is electrically connected to the microstrip transmission line 640 by a second set of parallel bondwires 631-2 that are separated from each other by bondwires 329-2 that electrically connect the drain of the second transistor to the second output lead 344-2. As shown in FIG. 6B, pairs of IPD bondwires 631-1 are separated by two output lead bondwires 329-1. Although an example of a bondwire distribution is provided in FIG. 6B, other distributions of bondwires are possible.

Figure 7A:
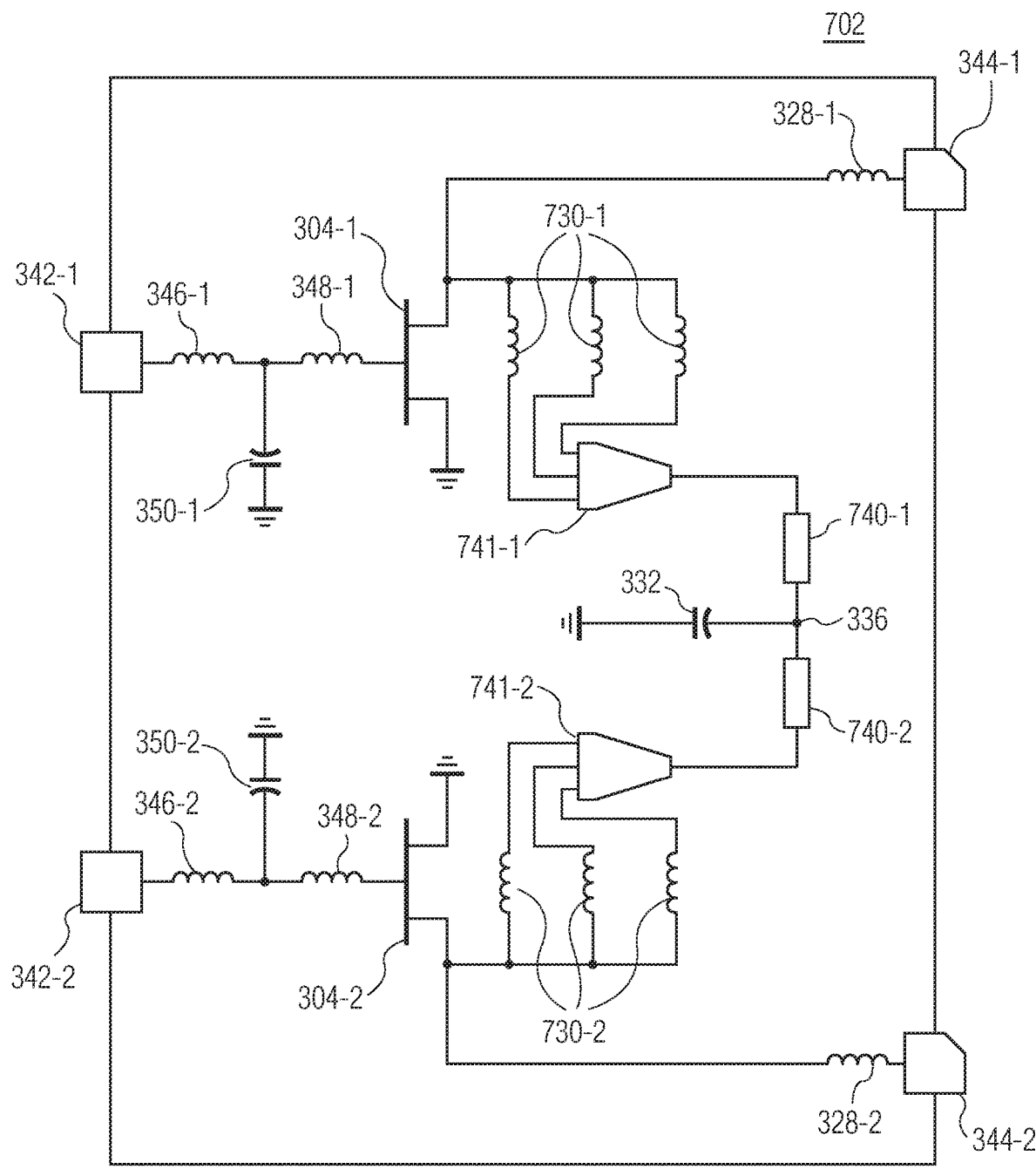
FIGS. 7A and 7B depict circuit-level and component-level layouts of an embodiment of a packaged RF amplifier that includes a common capacitance connected in parallel with a differential shunt with phase compensation in accordance with an embodiment of the invention.
Figure 7B:
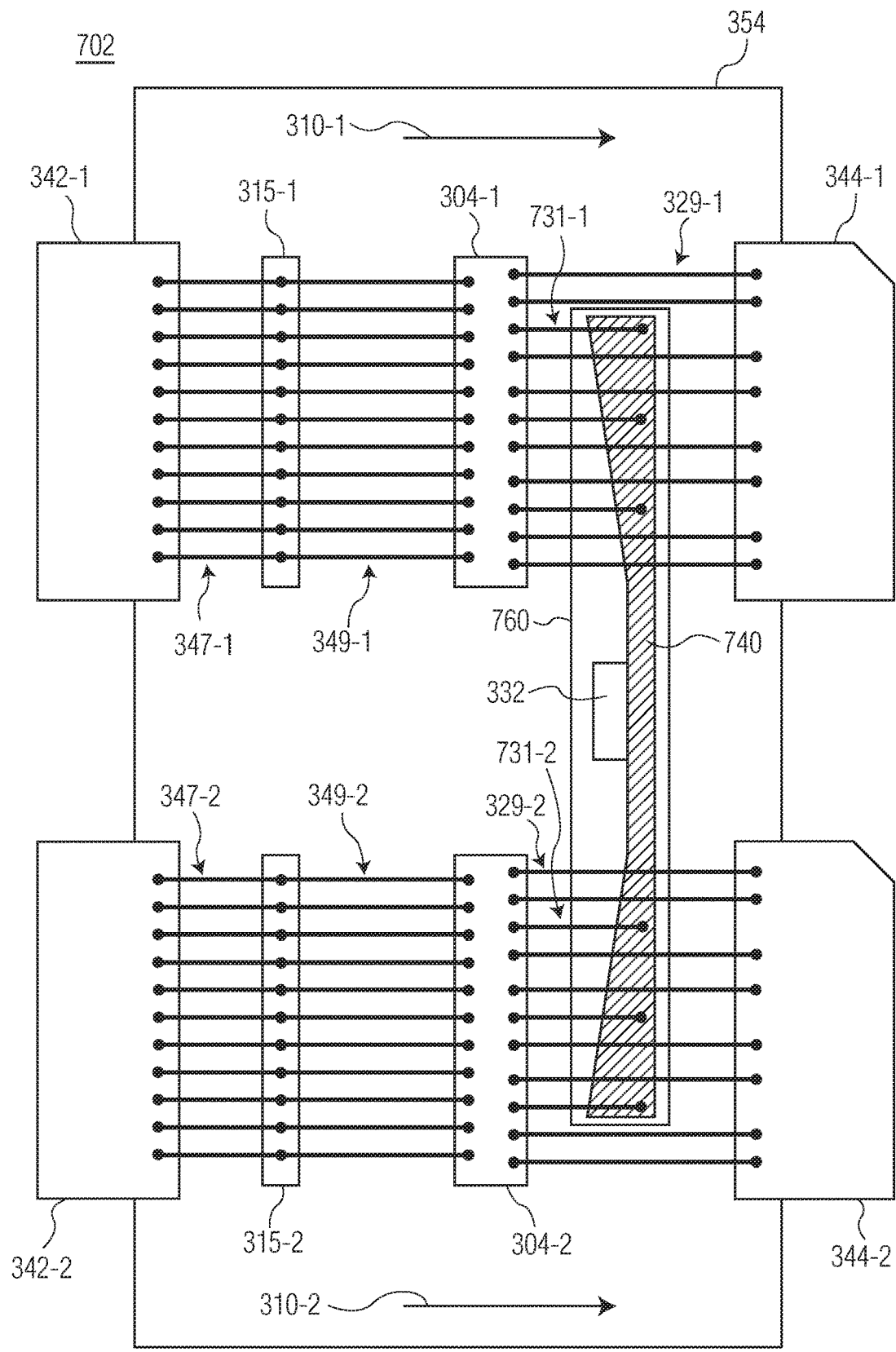

In an embodiment, the common capacitance is connected in parallel between the first and second RF signal paths in a spread shunt with phase compensation inductance configuration. FIGS. 7A and 7B depict an embodiment of a packaged RF amplifier 702 in which the common capacitance is connected in parallel in a spread shunt with phase compensation inductance configuration in accordance with an embodiment of the invention. In particular, FIG. 7A depicts a circuit-level layout of a configuration of a packaged RF amplifier and FIG. 7B depicts a corresponding component-level layout of the packaged RF amplifier.

With reference to the circuit-level layout of FIG. 7A, capacitance 332 is electrically connected to the drain of both of the transistors 304-1 and 304-2 such that the capacitance is electrically connected to both RF signal paths 310-1 and 310-2 in parallel and the shunt inductance is divided into three inductances 730-1 and 730-2, each corresponding to a portion of the microstrip transmission line 740, which portions are represented in FIG. 7A by element 741-1 and 741-2. In the example of FIG. 7A, the inductances have different magnitudes, for example, an increasing magnitude from left to right. As depicted in FIG. 7A, there is a node 336 between the shunt inductances 730-1 of the first RF signal path 310-1 and the shunt inductances 730-2 of the second RF signal path 310-2 and a first terminal of the capacitance is coupled to the node and a second terminal of the capacitance is coupled to ground.

With reference to the component-level layout of FIG. 7B, the packaged RF amplifier 702 includes an output IPD 760 that has a microstrip transmission line 740 and a capacitor 332 connected in parallel to the microstrip transmission line. As depicted in FIG. 7B, the drain of the first transistor 304-1 is electrically connected to the microstrip transmission line by a first set of parallel bondwires 731-1 (which corresponds to inductance 730-1, FIG. 7A) that are separated from each other by bondwires 329-1 that electrically connect the drain of the first transistor to the first output lead 344-1 and the drain of the second transistor 304-2 is electrically connected to the microstrip transmission line by a second set of parallel bondwires 731-2 (which corresponds to inductance 730-2, FIG. 7A) are separated from each other by bondwires 329-2 that electrically connect the drain of the second transistor to the second output lead 344-2. As shown in FIG. 7B, pairs of IPD bondwires 731-1 and 731-2 are separated by two output lead bondwires 329-1 and 329-2. Although an example of a bondwire distribution is provided in FIG. 7B, other distributions of bondwires are possible. Additionally, the microstrip transmission line includes tapered portions at each end. As shown, the tapered portions widen from an inner location to an end location. In an embodiment, the magnitude of the inductance increases as a function of the width of the microstrip transmission line at the point at with the corresponding bondwire is connected to the microstrip transmission line. Although an example of a microstrip transmission line with tapered ends is provided for phase compensation, other configurations of the microstrip transmission line may provide phase compensation.

Figure 8A:
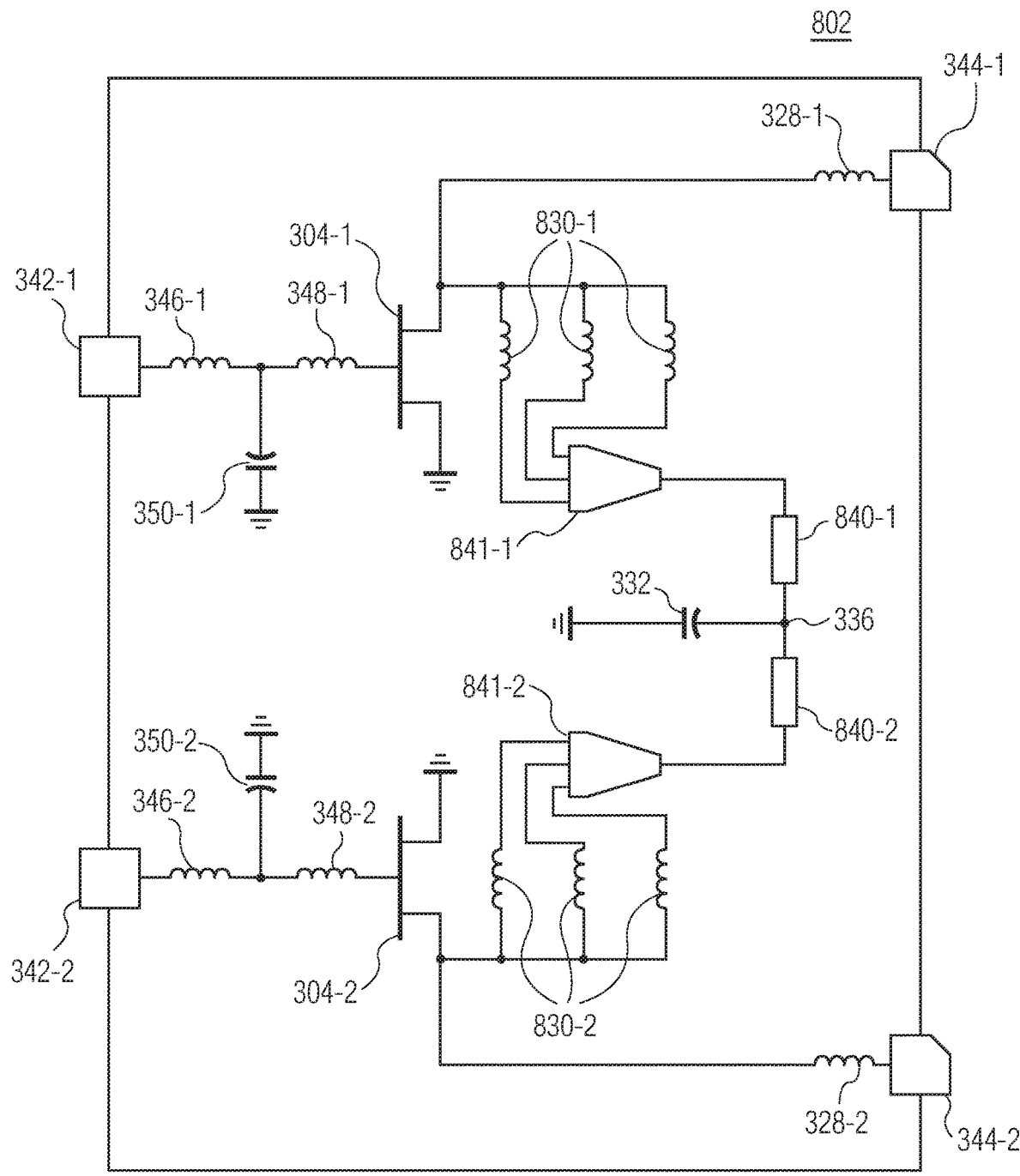
FIGS. 8A and 8B depict circuit-level and component-level layouts of another embodiment of a packaged RF amplifier that includes a common capacitance connected in parallel with a differential shunt with phase compensation in accordance with an embodiment of the invention.
Figure 8B:
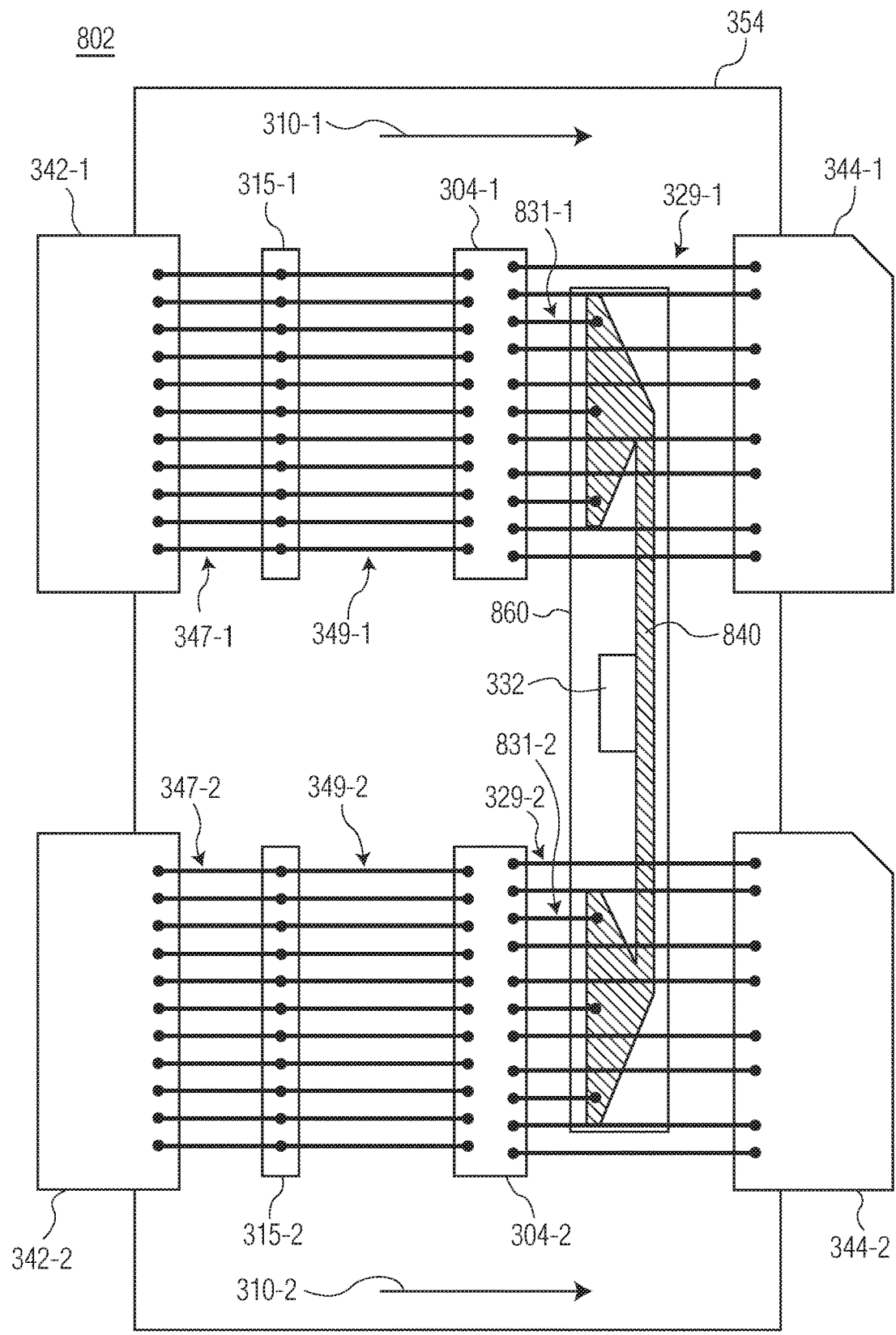

In an embodiment, the common capacitance is connected in parallel between the first and second RF signal paths in a spread shunt with phase compensation inductance configuration. FIGS. 8A and 8B depict an embodiment of a packaged RF amplifier 802 in which the common capacitance is connected in parallel in a spread shunt with phase compensation inductance configuration in accordance with an embodiment of the invention. In particular, FIG. 8A depicts a circuit-level layout of a configuration of a packaged RF amplifier and FIG. 8B depicts a corresponding component-level layout of the packaged RF amplifier. The embodiment of FIGS. 8A and 8B is similar to the embodiment of FIGS. 7A and 7B except that the configuration of the phase compensation is different.

With reference to the circuit-level layout of FIG. 8A, capacitance 332 is electrically connected to the drain of both of the transistors 304-1 and 304-2 such that the capacitance is electrically connected to both RF signal paths 310-1 and 310-2 in parallel and the shunt inductance is divided into three inductances 830-1 and 830-2, each corresponding to a portion of the microstrip transmission line 840, which portions are represented in FIG. 8A by element 841-1 and 841-2. In the example of FIG. 8A, the inductances have different magnitudes, for example, an increased magnitude in the center relative to the inductances on the left and right. As depicted in FIG. 8A, there is a node 336 between the shunt inductances 830-1 of the first RF signal path 310-1 and the shunt inductances 830-2 of the second RF signal path 310-2 and a first terminal of the capacitance is coupled to the node and a second terminal of the capacitance is coupled to ground.

With reference to the component-level layout of FIG. 8B, the packaged RF amplifier 802 includes an output IPD 860 that has a microstrip transmission line 840 and a capacitor 332 connected in parallel to the microstrip transmission line. As depicted in FIG. 8B, the drain of the first transistor 304-1 is electrically connected to the microstrip transmission line 840 by a first set of parallel bondwires 831-1 (which corresponds to inductance 830-1, FIG. 8A) that are separated from each other by bondwires 329-1 that electrically connect the drain of the first transistor to the first output lead 344-1 and the drain of the second transistor 304-1 is electrically connected to the microstrip transmission line 840 by a second set of parallel bondwires 831-2 (which corresponds to inductance 830-2, FIG. 8A) are separated from each other by bondwires 329-2 that electrically connect the drain of the second transistor to the second output lead 344-2. As shown in FIG. 8B, pairs of IPD bondwires 831-1 and 831-2 are separated by two output lead bondwires 329-1 and 329-2. Although an example of a bondwire distribution is provided in FIG. 8B, other distributions of bondwires are possible. Additionally, the microstrip transmission line includes triangular portions at each end. As shown, the triangular portions have a base and a vertex and the base is electrically connected to the drain of the transistors and the vertex is electrically connected to a linear portion of the microstrip transmission line. In an embodiment, the magnitude of the inductance is a function of the width of the triangular portion of the microstrip transmission line at the point at with the corresponding bondwire is connected to the microstrip transmission line. Although an example of a microstrip transmission line with triangular ends is provided for phase compensation, other configurations of the microstrip transmission line may provide phase compensation.

Figure 9A:
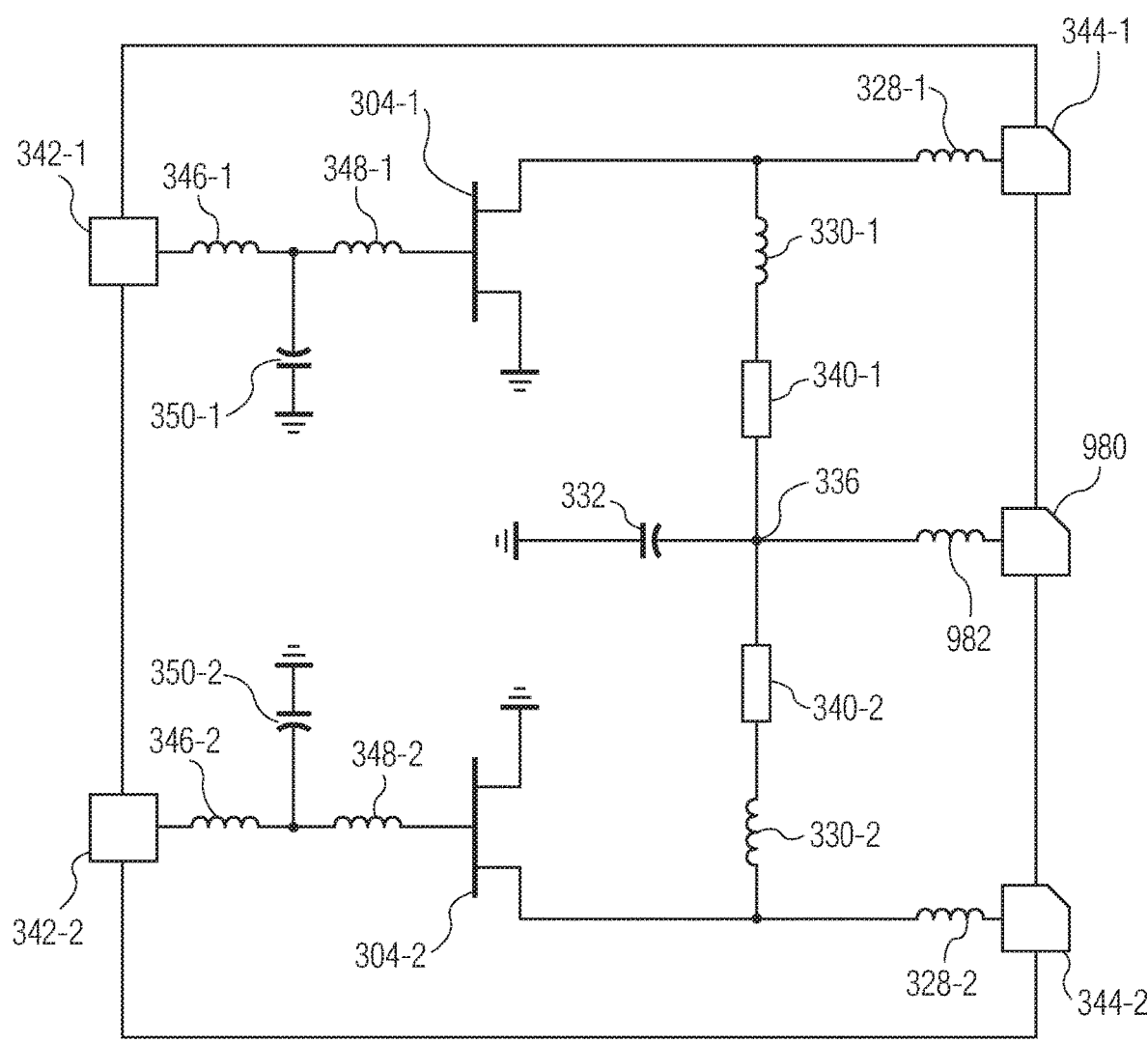
FIGS. 9A and 9B depict circuit-level and component-level layouts of an embodiment of a packaged RF amplifier that includes a common capacitance connected in parallel with a modulator input in accordance with an embodiment of the invention.
Figure 9B:
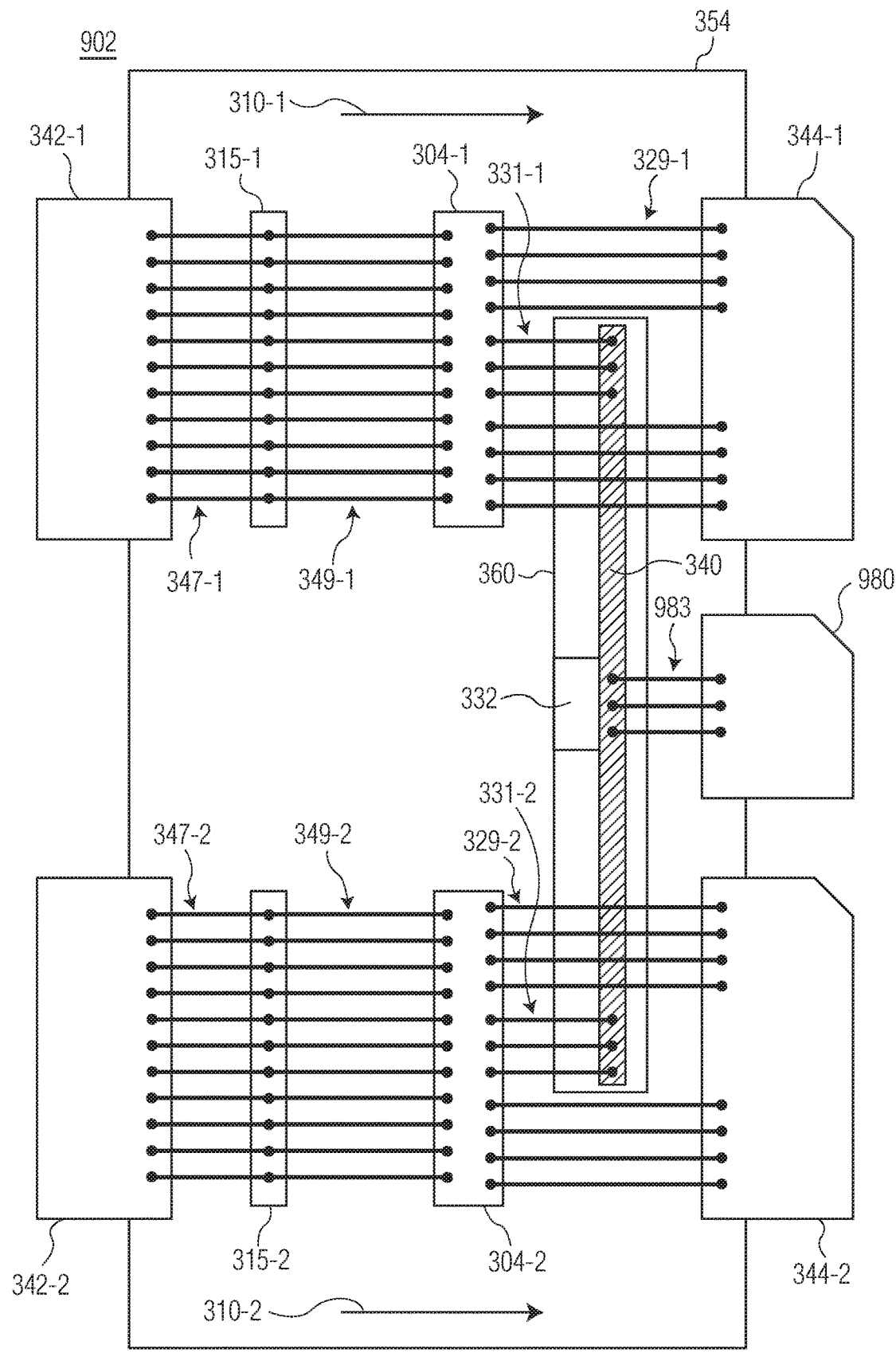

In an embodiment, the common capacitance is connected in parallel between the first and second RF signal paths and the packaged RF amplifier further includes a low inductance modulator lead connected to the output IPD. FIGS. 9A and 9B depict an embodiment of a packaged RF amplifier 902 in which the common capacitance is connected in parallel and the packaged RF amplifier further includes a low inductance modulator lead connected to the output IPD in accordance with an embodiment of the invention. In particular, FIG. 9A depicts a circuit-level layout of a configuration of a packaged RF amplifier and FIG. 9B depicts a corresponding component-level layout of the packaged RF amplifier.

With reference to the circuit-level layout of FIG. 9A, capacitance 332 is electrically connected to the drain of both of the transistors 304-1 and 304-2 such that the capacitance is electrically connected to both RF signal paths 310-1 and 310-2 in parallel as described with reference to FIG. 3A. As depicted in FIG. 9A, a modulator lead 980 is electrically connected to the node 336 between the shunt inductance 330-1 of the first RF signal path and the shunt inductance 330-2 of the second RF signal path. An inductance 982 also exists between the modulator lead 980 and the node 336.

With reference to the component-level layout of FIG. 9B, the packaged RF amplifier 902 includes an output IPD 360 that has a microstrip transmission line 340 and a capacitor 332 connected in parallel to the microstrip transmission line as described above with reference to FIG. 3B. As depicted in FIG. 9B, the modulator lead 980 is electrically connected to the microstrip transmission line 340 of the output IPD 360 by bondwires 983. In the example of FIG. 9B, the bondwires are connected to the center of the microstrip transmission line and nearby to the capacitor. In an embodiment, the location of the bondwires 983 is selected to minimize phase difference between the wirebond closest to the center of the conductor (e.g., the microstrip transmission line 340) and the end wires 331-1 and 331-2. The distance from one set of bondwires to the other set of bondwires determines the overall inductance in the shunt path.

Figure 10A:
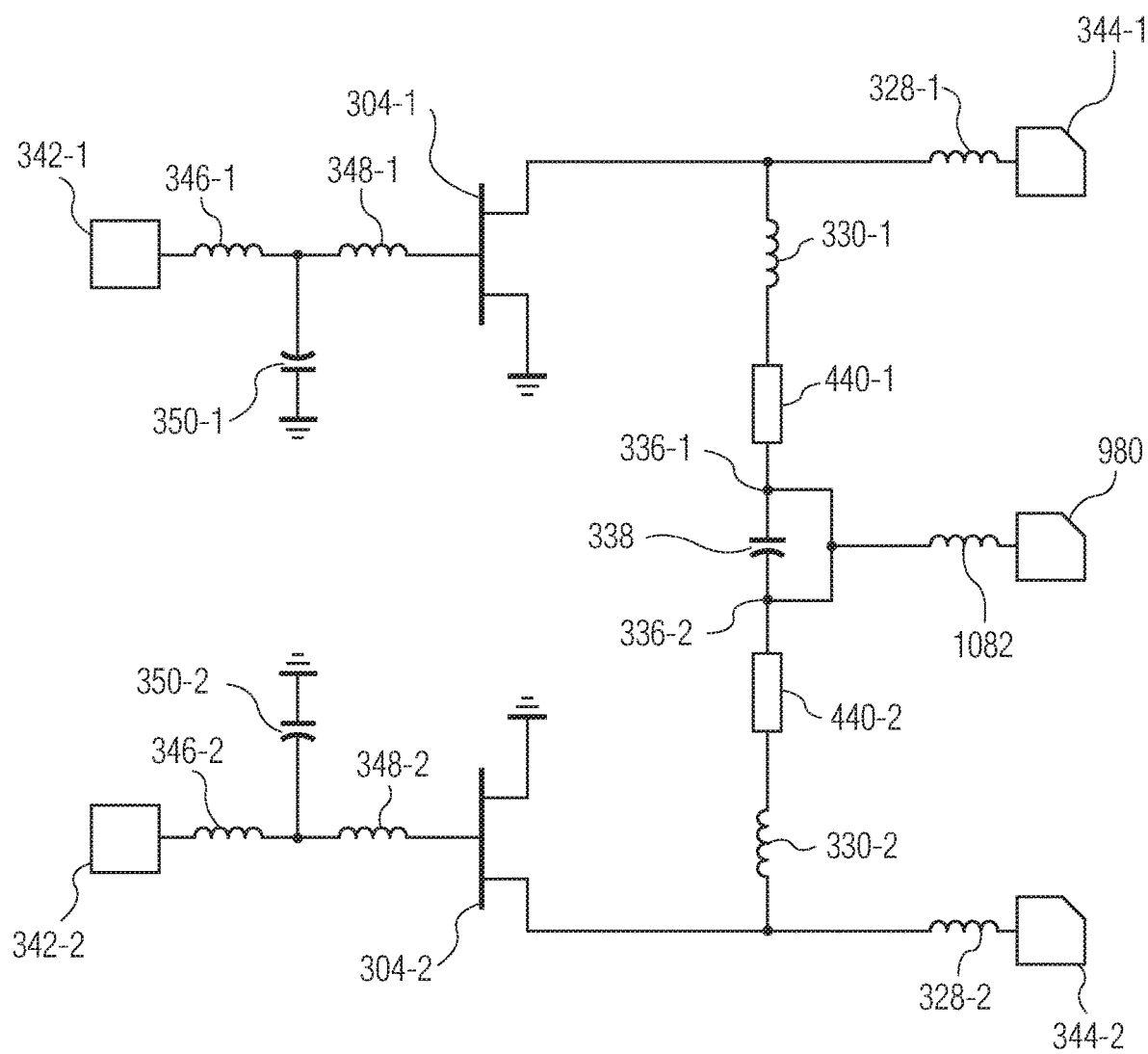
FIGS. 10A and 10B depict circuit-level and component-level layouts of an embodiment of a packaged RF amplifier that includes a common capacitance connected in series with a modulator input in accordance with an embodiment of the invention.
Figure 10B:
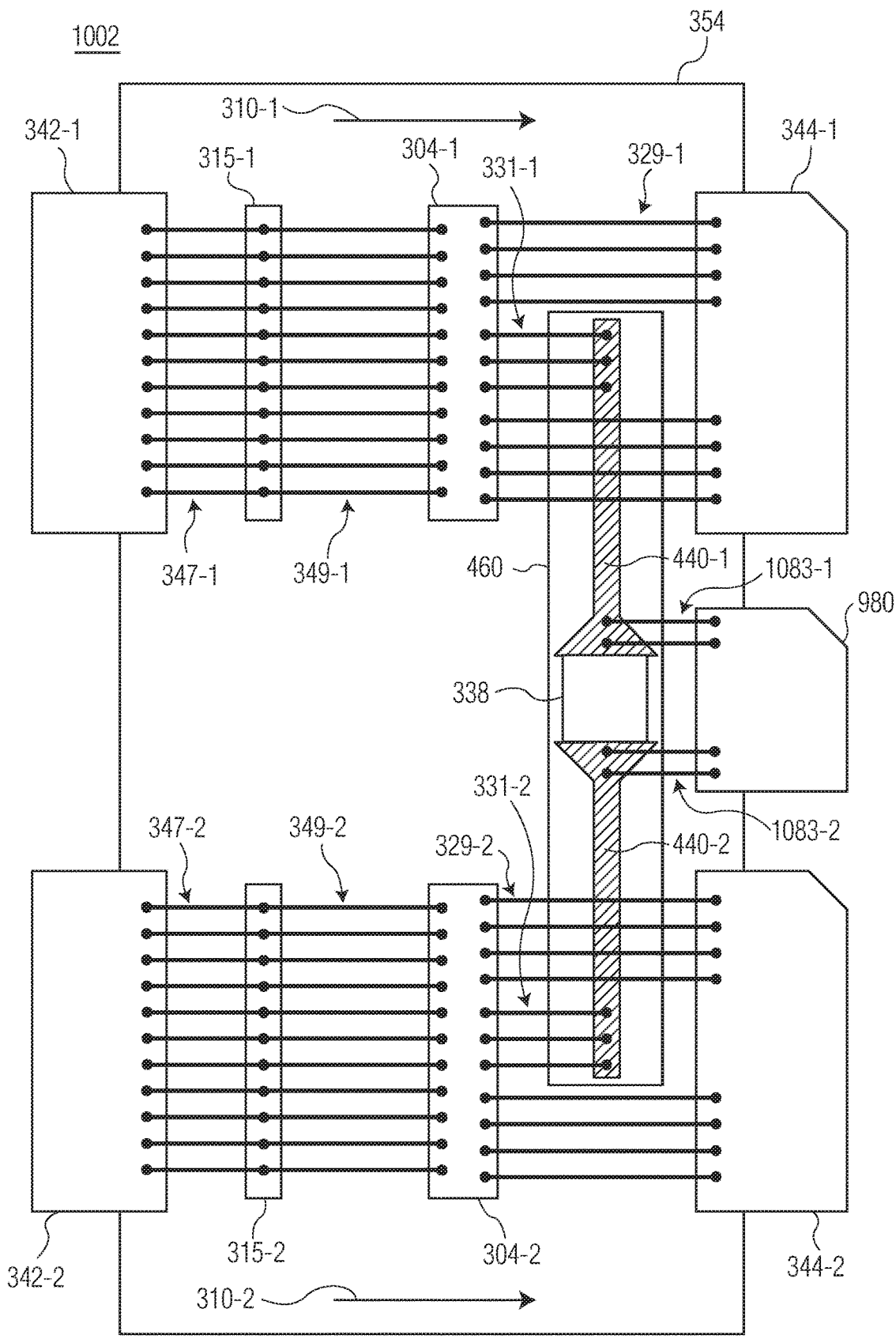

In an embodiment, the common capacitance is connected in series between the first and second RF signal paths and the packaged RF amplifier further includes a low inductance modulator lead connected to the output IPD. FIGS. 10A and 10B depict an embodiment of a packaged RF amplifier 1002 in which the common capacitance is connected in series and the packaged RF amplifier further includes a low inductance modulator lead connected to the output IPD in accordance with an embodiment of the invention. In particular, FIG. 10A depicts a circuit-level layout of a configuration of a packaged RF amplifier and FIG. 10B depicts a corresponding component-level layout of the packaged RF amplifier.

With reference to the circuit-level layout of FIG. 10A, capacitance 332 is electrically connected to the drain of both of the transistors 304-1 and 304-2 such that the capacitance is electrically connected to both RF signal paths 310-1 and 310-2 in series as described above with reference to FIG. 4A. As depicted in FIG. 10A, a modulator lead 980 is electrically connected to either side of the capacitance 332. An inductance 1082 also exists between the modulator lead 980 and the node 336-1 and 336-2.

With reference to the component-level layout of FIG. 10B, the packaged RF amplifier 1002 includes an output IPD 460 that includes a first microstrip transmission line 440-1, a second microstrip transmission line 440-2, and a capacitor 332 as described above with reference to FIG. 4B. The capacitor is electrically connected in series between the first microstrip transmission line and the second microstrip transmission line. As depicted in FIG. 10B, the modulator lead 980 is electrically connected to the first microstrip transmission line 440-1 and to the second microstrip transmission line 440-2 of the output IPD 460 by bondwires 1083-1 and 1083-2. In the example of FIG. 10B, the bondwires are connected to either side of capacitor near the terminals of the capacitor. In an embodiment, the location of the bondwires 1083-1 and 1083-2 is selected to minimize phase difference between the wirebond closest to the center of the conductor (e.g., the microstrip transmission line 440-1 and 440-2) and the end wires 331-1 and 331-2. In an embodiment, a node corresponding to the capacitor 338 represents the RF cold point (e.g., essentially the combination of the series inductance and the capacitance 338). The RF cold point is where the modulator or bias feed can be brought in without affecting the RF tuning. In such an embodiment, the series capacitance can be utilized because the push-pull circuit creates a virtual ground at RF frequencies.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A radio frequency (RF) amplifier comprising:
   a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface;
   a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface; and
   a conductive path between the current conducting terminal of the first transistor and the current conducting terminal of the second transistor, wherein the conductive path includes a first inductance, a second inductance, and a capacitance electrically connected between the first inductance and the second inductance;
   wherein the conductive path comprises a microstrip transmission line, and wherein the current conducting terminal of the first transistor and the current conducting terminal of the second transistor are electrically connected to the microstrip transmission line; and
   the current conducting terminal of the first transistor is electrically connected to the microstrip transmission line by a first set of parallel bondwires, the first set of parallel bondwires corresponding to the first inductance; and
   the current conducting terminal of the second transistor is electrically connected to the microstrip transmission line by a second set of parallel bondwires, the second set of parallel bondwires corresponding to the second inductance.

2. The RF amplifier of claim 1, wherein the capacitance is connected in parallel to the microstrip transmission line between the first inductance and the second inductance.

3. The RF amplifier of claim 2, wherein a capacitance value of the capacitance is 3-20 pF.

4. The RF amplifier of claim 1, wherein the capacitance is connected in parallel to the microstrip transmission line between the first inductance and the second inductance.

5. The RF amplifier of claim 1, wherein:
   the first set of parallel bondwires are directly adjacent to each other; and
   the second set of parallel bondwires are directly adjacent to each other.

6. The RF amplifier of claim 1, wherein:
   the first set of parallel bondwires are separated from each other by bondwires that electrically connect the current conducting terminal of the first transistor to the first RF output interface, the first set of parallel bondwires corresponding to the first inductance; and
   the second set of parallel bondwires are separated from each other by bondwires that electrically connect the current conducting terminal of the second transistor to the second RF output interface.

7. The RF amplifier of claim 1, further comprising a second conductive path between the control terminal of the first transistor and the control terminal of the second transistor, wherein the second conductive path includes a third inductance, a fourth inductance, and a second capacitance electrically connected between the third inductance and the fourth inductance.

8. The RF amplifier of claim 7, wherein:
   the second conductive path comprises a second microstrip transmission line, and wherein the control terminal of the first transistor and the control terminal of the second transistor are electrically connected to the second microstrip transmission line.

9. The RF amplifier of claim 1, wherein:
   wherein the microstrip transmission line comprises a tapered structure.

10. The RF amplifier of claim 9, wherein:
    the current conducting terminal of the first transistor is electrically connected to the microstrip transmission line by the first set of parallel bondwires at a first tapered structure of the microstrip transmission line;
    the current conducting terminal of the second transistor is electrically connected to the microstrip transmission line by the second set of parallel bondwires at a second tapered structure of the microstrip transmission line.

11. The RF amplifier of claim 1, further comprising:
    a modulator input interface that is electrically connected to the microstrip transmission line.

12. A radio frequency (RF) amplifier comprising:
    a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface;

a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface; and a conductive path between the current conducting terminal of the first transistor and the current conducting terminal of the second transistor, wherein the conductive path includes a first inductance, a second inductance, and a capacitance electrically connected between the first inductance and the second inductance;

wherein:

the conductive path comprises first and second microstrip transmission lines;

the current conducting terminal of the first transistor is electrically connected to the first microstrip transmission line;

the current conducting terminal of the second transistor is electrically connected to the second microstrip transmission line; and the capacitance is electrically connected in series between the first and second microstrip transmission lines.

13. The RF amplifier of claim 12, wherein:

the current conducting terminal of the first transistor is electrically connected to the first microstrip transmission line by a first set of parallel bondwires, the first set of parallel bondwires corresponding to the first inductance; and the current conducting terminal of the second transistor is electrically connected to the microstrip transmission line by a second set of parallel bondwires, the second set of parallel bondwires corresponding to the second inductance.

14. The RF amplifier of claim 12, further comprising a modulator input interface that is electrically connected to the first microstrip transmission line and to the second microstrip transmission line.

15. A radio frequency (RF) amplifier comprising:

a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface;

a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface; and a conductive path between the current conducting terminal of the first transistor and the current conducting terminal of the second transistor, wherein the conductive path includes a first inductance, a second inductance, and a capacitance electrically connected between the first inductance and the second inductance;

wherein the conductive path comprises a microstrip transmission line, and wherein the current conducting terminal of the first transistor and the current conducting terminal of the second transistor are electrically connected to the microstrip transmission line;

wherein the capacitance is connected in parallel to the microstrip transmission line between the first inductance and the second inductance.

16. A radio frequency (RF) amplifier comprising:

a first RF signal path having a first RF input interface, a first RF output interface, and a first transistor connected between the first RF input interface and the first RF output interface, wherein a control terminal of the first transistor is connected to the first RF input interface and a current conducting terminal of the first transistor is connected to the first RF output interface;

a second RF signal path having a second RF input interface, a second RF output interface, and a second transistor connected between the second RF input interface and the second RF output interface, wherein a control terminal of the second transistor is connected to the second RF input interface and a current conducting terminal of the second transistor is connected to the second RF output interface;

a conductive path between the current conducting terminal of the first transistor and the current conducting terminal of the second transistor, wherein the conductive path includes a first inductance, a second inductance, and a capacitance electrically connected between the first inductance and the second inductance; and a modulator input interface that is electrically connected to the conductive path.

* * * * *